United States Patent
Wiesbauer et al.

(10) Patent No.: US 9,494,477 B2
(45) Date of Patent: Nov. 15, 2016

(54) DYNAMIC PRESSURE SENSOR

(71) Applicant: Infineon Technologies AG, Neubiberg (DE)

(72) Inventors: Andreas Wiesbauer, Poertschach (AT); Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 253 days.

(21) Appl. No.: 14/231,068

(22) Filed: Mar. 31, 2014

(65) Prior Publication Data

US 2015/0276529 A1    Oct. 1, 2015

(51) Int. Cl.
| | |
|---|---|
| *G01L 9/00* | (2006.01) |
| *B81B 3/00* | (2006.01) |
| *H04R 1/08* | (2006.01) |
| *G01L 9/08* | (2006.01) |

(52) U.S. Cl.
CPC ........... *G01L 9/0072* (2013.01); *B81B 3/0021* (2013.01); *G01L 9/0073* (2013.01); *G01L 9/0082* (2013.01); *G01L 9/085* (2013.01); *H04R 1/08* (2013.01); *B81B 2201/0264* (2013.01); *G01L 9/0042* (2013.01); *H04R 2201/003* (2013.01)

(58) Field of Classification Search
None
See application file for complete search history.

(56) References Cited

U.S. PATENT DOCUMENTS

| | | | |
|---|---|---|---|
| 6,075,867 A | 6/2000 | Bay et al. | |
| 7,190,038 B2 | 3/2007 | Dehe et al. | |
| 7,473,572 B2 | 1/2009 | Dehe et al. | |
| 7,912,236 B2 | 3/2011 | Dehe et al. | |
| 8,169,041 B2 | 5/2012 | Pahl et al. | |
| 8,447,054 B2 | 5/2013 | Bharatan et al. | |
| 2006/0141656 A1 | 6/2006 | Dehe et al. | |
| 2007/0113664 A1 | 5/2007 | Wang | |
| 2007/0275494 A1* | 11/2007 | Mayer | B81C 1/0023 438/50 |
| 2007/0275495 A1* | 11/2007 | Mayer | B81C 1/00238 438/50 |
| 2007/0284682 A1 | 12/2007 | Laming et al. | |
| 2011/0150260 A1 | 6/2011 | Miles | |
| 2013/0223654 A1 | 8/2013 | Dehe et al. | |
| 2013/0264663 A1 | 10/2013 | Dehe et al. | |
| 2014/0053651 A1* | 2/2014 | Besling | G01L 9/0042 73/702 |
| 2014/0329206 A1* | 11/2014 | Yudintsev | G09B 9/302 434/43 |
| 2015/0207435 A1 | 7/2015 | Rombach | |
| 2016/0003698 A1* | 1/2016 | Wiesbauer | G01L 13/025 381/174 |

FOREIGN PATENT DOCUMENTS

| | | |
|---|---|---|
| DE | 112007002441 T5 | 1/2010 |
| DE | 102013203180 A1 | 8/2013 |
| DE | 102013205527 A1 | 10/2013 |
| DE | 102012107457 A1 | 2/2014 |

OTHER PUBLICATIONS

Bay, J., "Silicon Microphone for Hearing Aid Applications," Mikroelektronic Centret—Microtronic A/S, Jun. 1997, 20 pages.
Wang, C.C., et al., "Contamination-Insensitive Differential Capacitive Pressure Sensors," Journal of Microelectromechanical Systems, vol. 9, No. 4, Dec. 2000, pp. 538-543.

* cited by examiner

*Primary Examiner* — Andre Allen
(74) *Attorney, Agent, or Firm* — Slater Matsil, LLP

(57) ABSTRACT

According to various embodiments, a dynamic pressure sensor includes a substrate, a reference volume formed in the substrate, a deflectable membrane sealing the reference volume, a deflection sensing element coupled to the membrane and configured to measure a deflection of the membrane, and a ventilation hole configured to equalize an absolute pressure inside the reference volume with an absolute ambient pressure outside the reference volume.

32 Claims, 18 Drawing Sheets

DYNAMIC PRESSURE SENSOR

TECHNICAL FIELD

The present invention relates generally to sensor technologies, and, in particular embodiments, to a system and method for a dynamic pressure sensor.

BACKGROUND

Transducers that convert signals from one domain to another are often used in sensors. A common sensor that includes a transducer is a pressure sensor that converts pressure differences and/or pressure changes to electrical signals. Pressure sensors have numerous applications including, for example, atmospheric pressure sensing, altitude sensing, and weather monitoring.

Microelectromechanical system (MEMS) based sensors include a family of transducers produced using micromachining techniques. MEMS, such as a MEMS pressure sensor, gather information from the environment by measuring the change of physical state in the transducer and transferring the signal to be processed by the electronics, which are connected to the MEMS sensor. MEMS devices may be manufactured using micromachining fabrication techniques similar to those used for integrated circuits.

MEMS devices may be designed to function as oscillators, resonators, accelerometers, gyroscopes, pressure sensors, microphones, and/or micro-mirrors, for example. Many MEMS devices use capacitive sensing techniques for transducing the physical phenomenon into electrical signals. In such applications, the capacitance change in the sensor is converted to a voltage signal using interface circuits.

Pressure sensors may also be implemented as capacitive MEMS devices that include a sealed volume and a deflectable membrane. A pressure difference between the sealed volume and an external volume, such as the ambient environment in some cases, causes the membrane to deflect. Generally, the deflection of the membrane causes a change in distance between the membrane and a sensing electrode, thereby changing the capacitance. Thus, the pressure sensor measures the absolute pressure because the sealed volume provides a fixed reference pressure to compare against an external pressure.

SUMMARY OF THE INVENTION

According to various embodiments, a dynamic pressure sensor includes a substrate, a reference volume formed in the substrate, a deflectable membrane sealing the reference volume, a deflection sensing element coupled to the membrane and configured to measure a deflection of the membrane, and a ventilation hole configured to equalize an absolute pressure inside the reference volume with an absolute ambient pressure outside the reference volume.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
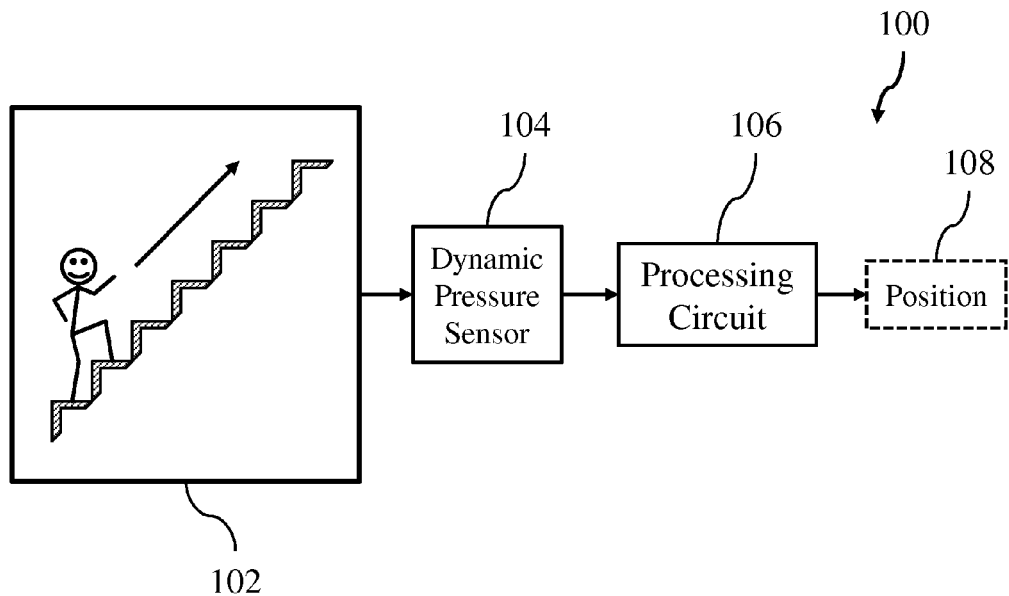
FIGS. 1a-1e illustrate functional block diagrams of embodiment dynamic pressure sensor systems and components.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely pressure sensors, and more particularly, dynamic pressure sensors. Some of the various embodiments described herein include MEMS transducer systems, MEMS pressure sensors, pressure transducer and MEMS pressure transducer systems, dynamic MEMS pressure sensors, piezoelectric pressure sensors, and pressure sensor systems including dynamic and absolute pressure sensors. Example usage environments are presented for indoor navigation; however, such examples are in no way limiting. In other embodiments, aspects may also be applied to other applications involving any type of pressure sensor or transducer converting a physical signal to another domain for any application according to any fashion as known in the art.

Pressure sensors may be used in numerous applications, such as indoor navigation and gesture recognition, for example. In such applications very small altitude changes result in very small pressure changes. For example, a pressure change of 0.02 millibars (mbar) or 2 Pascal (Pa) is equivalent to an altitude change of about 20 cm. Conventional absolute pressure sensors generally include a sealed reference volume and have a pressure range of about 1300 mbar with a resolution of about 0.02 mbar.

According to various embodiments, a dynamic pressure sensor with an increased sensitivity is disclosed herein. In various embodiments, the dynamic pressure sensor includes a sensing membrane with a ventilation hole or a group of ventilation holes. The ventilation hole slowly equalizes the pressure between a reference volume and an external volume, such as the ambient environment. Such a dynamic pressure sensor is capable of sensing pressure changes in a certain time period. Generally, pressure changes having frequencies in the infrasonic range, such as for navigation and gesture recognition, include pressure changes having frequencies below 20 Hz. Various embodiment dynamic pressure sensors described herein sense pressure changes in the infrasonic range. In some embodiments, pressure changes having frequencies between 0.1 Hz and 10 Hz are sensed, corresponding to pressure changes occurring over a time period of between 1 and 10 seconds. In some embodiments, the ventilation hole prevents the absolute pressure from being measured. According to various embodiments, such a dynamic pressure sensor has an increased resolution of about 0.0002 mbar, for example, and is capable of detecting altitude changes smaller than 1 cm.

FIGS. 1a-1e illustrate functional block diagrams of embodiment dynamic pressure sensor systems 100, 101, and 103, as well as embodiment components. Dynamic pressure sensor system 100 depicted in FIG. 1a includes pressure change 102, dynamic pressure sensor 104, processing circuit 106, and position signal 108. Pressure change 102 depicts, as an example, a person climbing a set of stairs. For each stair there is an equivalent rise in altitude of about 15-20 cm. As mentioned above, such an altitude rise corresponds to a pressure change of about 0.01-0.02 mbar per stair. Pressure change 102 is sensed by dynamic pressure sensor 104. In various embodiments, dynamic pressure sensor 104 includes a bandpass frequency response with a low frequency cutoff of 0.1 Hz and a high frequency cutoff of 10 Hz. A pressure change for each stair in pressure change 102 occurs with a frequency that fits within this passed frequency band (i.e. 0.1-10 Hz). The sensed pressure change may then be provided to processing circuit 106 that records the pressure changes. Processing circuit 106 may be implemented with digital or analog electronics as and integrator or by using different types of filters or other functional blocks, as is described further below. According to various embodiments, the processed pressure changes produce an elevation or position signal 108. In some embodiments, position signal 108 corresponds to a change in vertical position signal.

According to an example embodiment, a threshold level is set such that a certain gesture recognition algorithm is initiated when the threshold level is crossed. In some embodiments, integrating the output of dynamic pressure sensor 104 determines the absolute pressure. In other embodiments, an inverse high pass filter may be used (as is discussed in reference to FIG. 3b) such that both dynamic and absolute pressure signals are determined. In further embodiments, a linear function evaluates only dynamic pressure changes. In various embodiments, a counter may be used to count the number of up/down events which exceed a positive and/or negative threshold such that gesture or navigation information may be determined. Such various functions may be performed in processing circuit 106, which may be implemented in an application processor or in an application specific integrated circuit (ASIC) coupled directly to dynamic pressure sensor 104. In some embodiments, processing circuit 106 is implemented in a first part by an ASIC and in a second part by an application processor.

Figure 1B:
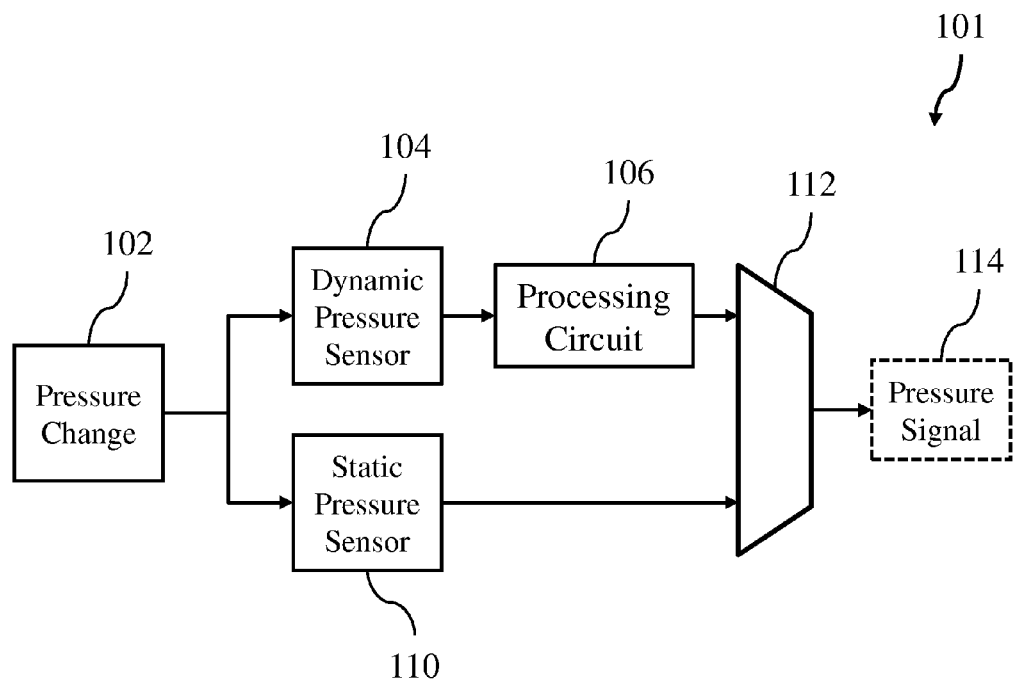

Dynamic pressure sensor system 101 depicted in FIG. 1b includes pressure change 102, dynamic pressure sensor 104, processing circuit 106, static pressure sensor 110, multiplexer 112, and pressure signal 114. According to various embodiments, dynamic pressure sensor 104 includes a ventilation hole in a sensing membrane that prevents the absolute pressure from being measured. Including a static (absolute) pressure sensor 110 in system 101 allows system 101 to sense high resolution pressure changes and the absolute pressure. In various embodiments, dynamic pressure sensor 104 and static pressure sensor 110 may be used together in certain usage scenarios or separately in other usage scenarios. For example, static pressure sensor 110 may measure atmospheric pressure and be used for weather applications while dynamic pressure sensor 104 may measure small elevation changes for indoor navigation or gesture recognition as described above. In some embodiments, dynamic pressure sensor 104 and processing circuit 106 provide a change in elevation signal to multiplexer 112 and static pressure sensor 110 provides the absolute pressure to multiplexer 112. In such embodiments, pressure signal 114 may include an absolute pressure signal or a change-in-pressure/change-in-elevation signal depending on which input of multiplexer 112 is selected. In other embodiments, multiplexer 112 may be replaced with a modified summation function that combines pressure change signals with absolute pressure signals in order to generate a more accurate pressure signal 114. In some embodiments, when processing circuit 106 includes an integrator, the static pressure signal from static pressure sensor 110 may be used to reset the integrator in processing circuit 106 in order to avoid integrator output drift initiated by unwanted offset in dynamic pressure sensor 104.

Figure 1C:
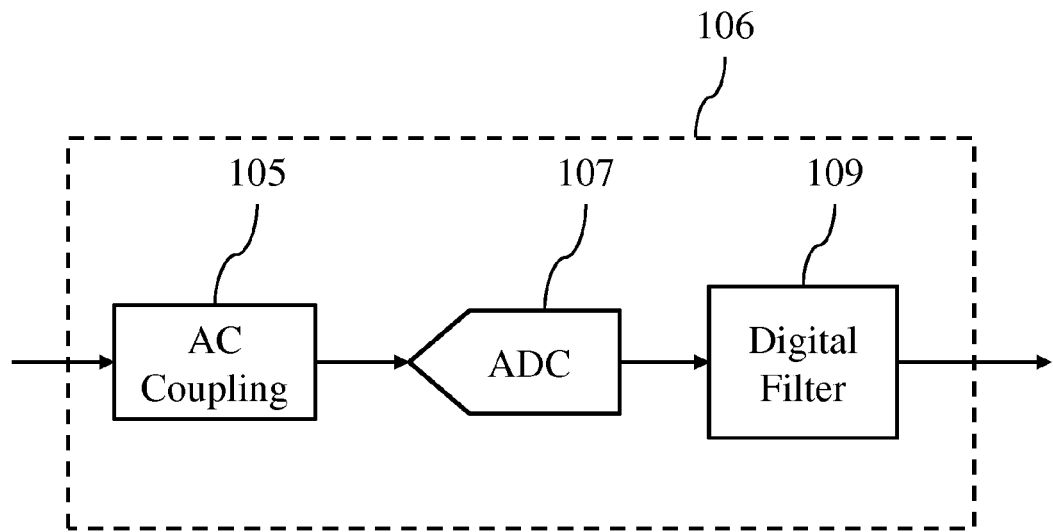
Figure 1D:
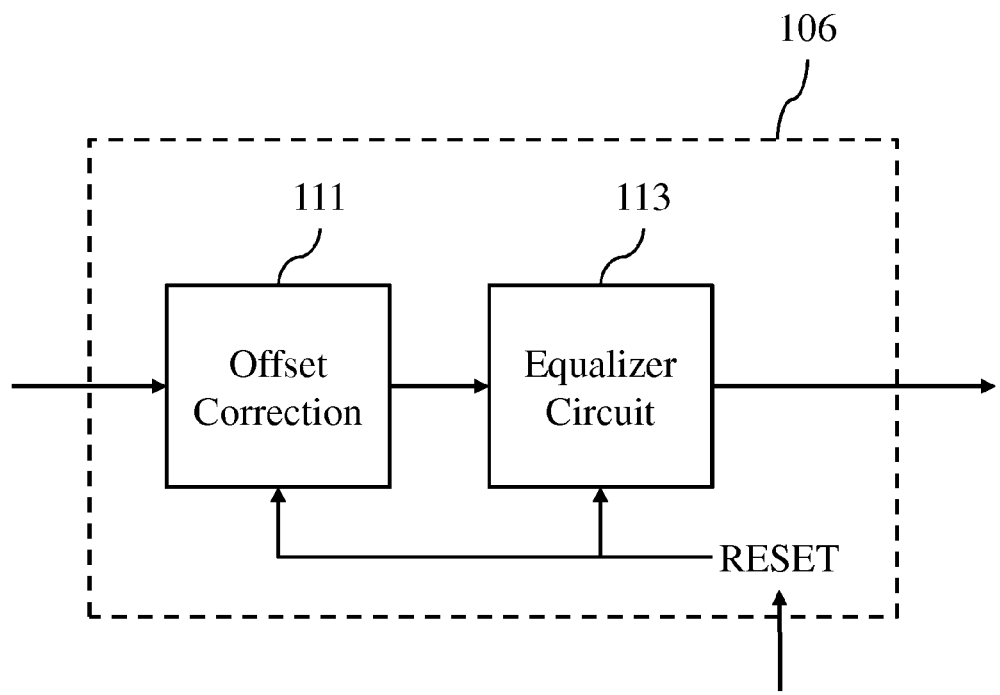

FIGS. 1c and 1d illustrate functional block diagrams of two embodiment processing circuits 106. FIG. 1c illustrates an embodiment processing circuit 106 that includes AC coupling 105, analog to digital converter (ADC) 107, and digital filter 109. In such embodiments, digital filter 109 may implement an inverse high pass filter, as described in reference to FIG. 3b below, or another type of integration function. In other embodiments, any type of pressure history tracking function may be implemented in processing circuit 106.

FIG. 1d illustrates an embodiment processing circuit 106 that includes offset correction 111 and an equalizer circuit 113. Offset correction 111 may reset an input signal from dynamic pressure sensor 104 in order to remove or prevent output offset drift. Equalizer 113 may boost specific frequency bands or filter specific frequency bands in order to equalize or emphasize certain signals related to dynamic pressure changes. For example, equalizer 113 may boost or pass signals having frequency components of 0.1 to 10 Hz while removing or lessening the effects of frequencies outside this frequency band.

In various embodiments, processing circuit 106 may be implemented as a combination of any of the embodiments presented. For example, processing circuit 106 may include an analog low pass filter, a digital low pass filter, an integration block implemented with digital or analog circuit, or combinations of such components included with embodiments as described in FIGS. 1c and 1d. In such embodiments, processing circuit 106 may function to remove absolute pressure signals and determine a dynamic pressure change for determining altitude changes or performing gesture recognition, for example.

Figure 1E:
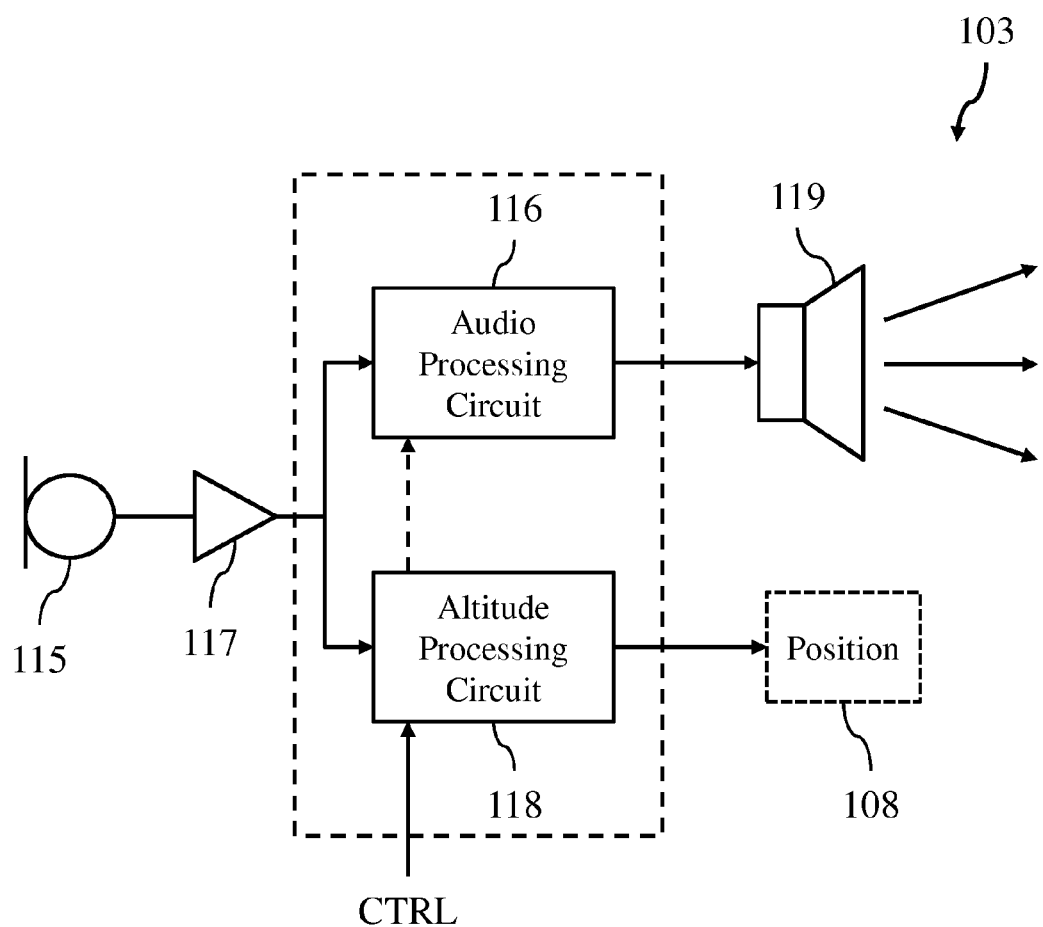

FIG. 1e illustrates another functional block diagram of another embodiment dynamic pressure sensor system 103 that includes an audio processing path and an altitude processing path. Microphone 115, such as a MEMS microphone, senses and transduces pressure changes corresponding to altitude changes and audio signals. For example, pressure signals having frequency components between 0.1 and 10 Hz may correspond to altitude changes while pressure signals having frequency components above 10 Hz and up to about 20 kHz may correspond to audio signals. The transduced pressure signals from microphone 115 are amplified at amplifier 117 and fed in parallel to audio processing circuit 116 and altitude processing circuit 118. In such embodiments, the audio signals are isolated and provided to an audio circuit, such as speaker 119, and the altitude signals are isolated and provided to a position circuit 108. Altitude processing circuit 118 may include components such as processing circuit 106 as described in reference to the other figures.

In some embodiments, audio processing circuit 116 and altitude processing circuit 118 may be included in a same application processor, as shown by the dotted line. In particular embodiments, a control signal CTRL may enable or disable either circuit. An ASIC may include amplifier 117 as well as other processing elements, such as filters for example. In some embodiments, a single IC includes microphone 115 as a MEMS microphone and amplifier 117.

Figure 2A:
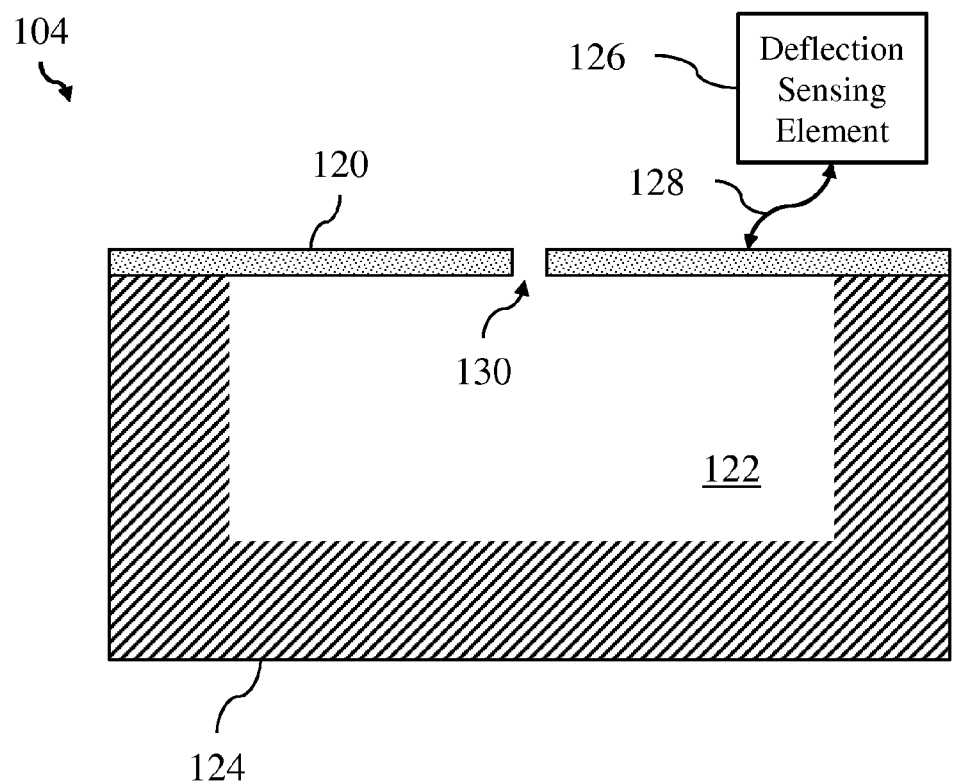
FIGS. 2a and 2b illustrate a cross-sectional view and a top view of an embodiment dynamic pressure sensor.
Figure 2B:
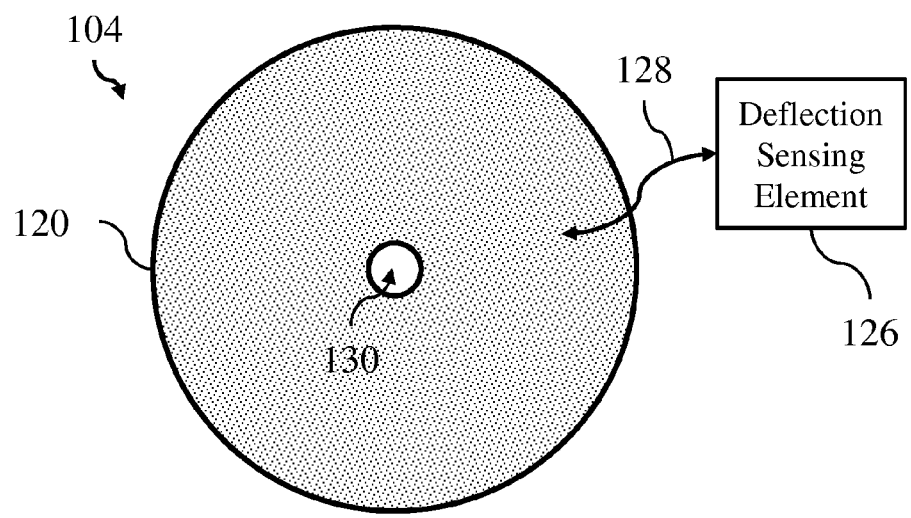

FIGS. 2a and 2b illustrate a cross-sectional view and a top view of an embodiment dynamic pressure sensor 104. FIG. 2a depicts the cross-sectional view of dynamic pressure sensor 104 including a deflectable membrane 120, a reference volume 122, a substrate 124, and a deflection sensing element 126. According to various embodiments, when a pressure change occurs outside reference volume 122, the pressure difference causes membrane 120 to deflect. Deflection sensing element 126 senses the deflection of membrane 120 and generates an output pressure signal (not shown). Deflection sensing element is coupled to membrane 120 by various coupling means, illustrated as coupling 128. As mentioned above, dynamic pressure sensor 104 includes a bandpass frequency response with a band between a low frequency cutoff $f_L$ (e.g., 0.1 Hz) and a high frequency cutoff $f_H$ (e.g., 10 Hz).

According to various embodiments, membrane 120 includes ventilation hole 130. The radius of the ventilation hole, which determines the planar area, controls the low frequency cutoff $f_L$ of the bandpass response. If the pressure change occurs with a frequency below the low frequency cutoff $f_L$ ventilation hole 130 equalizes the pressure outside reference volume 122 with the pressure inside reference volume 122 before membrane 120 deflects. For example, if $f_L$=0.1 Hz, a pressure changes taking longer than 10 seconds is be equalized by ventilation hole 130 and does not cause membrane 120 to deflect.

According to further embodiments, the high frequency cutoff $f_H$ prevents dynamic pressure sensor 104 from sensing rapid pressure changes such as sound waves. For example, if a door slams or loud music is playing, an elevation change does not occur. High frequency cutoff $f_H$ may be set so as to eliminate the effects of such sound waves and only sense lower frequency pressure changes, such as $f_H$=10 Hz. High frequency cutoff $f_H$ may be set by different mechanical or electronic characteristics as is be described in reference to more specific embodiments below.

FIG. 2b illustrates a top view of embodiment dynamic pressure sensor 104 including membrane 120 and deflection sensing element 126. A generic coupling 128 represents the coupling between deflection sensing element 126 and membrane 120. Membrane 120 include ventilation hole 130. In various embodiments, membrane 120 includes multiple ventilation holes. The planar area of ventilation hole, viewable from the top view, affects the low frequency cutoff $f_L$, as discussed above. If multiple ventilation holes are included, the total planar area of all the ventilation holes summed together affects the low frequency cutoff $f_L$. Other factors may affect the high and low frequency cutoffs, as is discussed below.

Figure 3A:
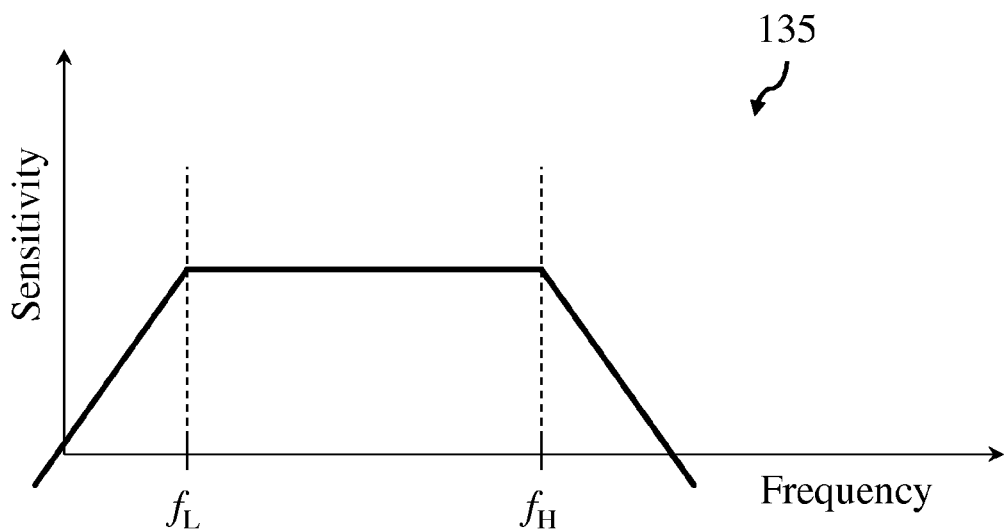
FIGS. 3a and 3b illustrate frequency characteristic plots for embodiment dynamic pressure sensors.
Figure 3B:
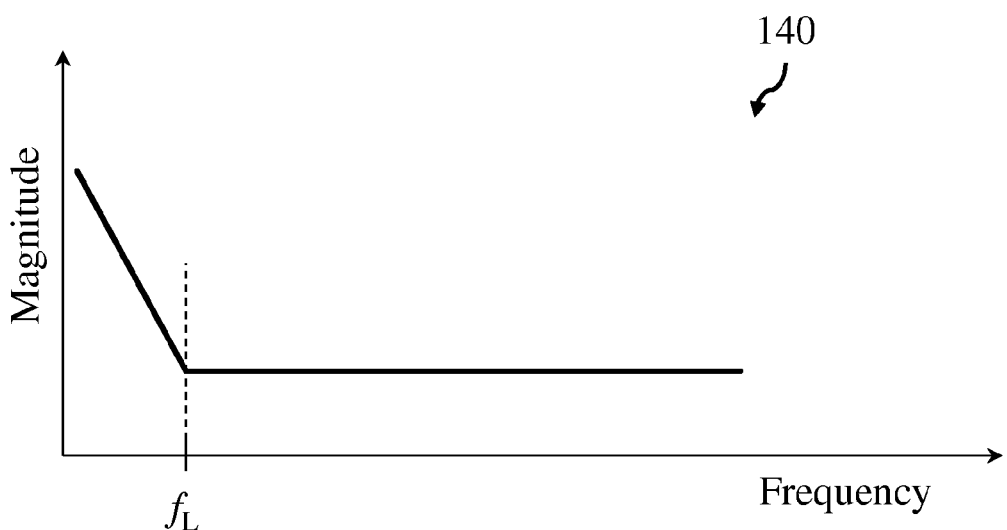

FIGS. 3a and 3b illustrate frequency characteristic plots 135 and 140 for embodiment dynamic pressure sensors. FIG. 3a illustrates a bandpass frequency response for the sensitivity of an embodiment dynamic pressure sensor. According to various embodiments, the high and low frequency cutoff frequencies $f_H$ and $f_L$ are corner frequencies for the bandpass response. Outside of the bandpass response, the sensitivity decreases rapidly. In some embodiments, the sensitivity shown on plot 135 is on a log scale and conveys order of magnitude changes. Thus, according to various embodiments, pressure changes occurring within the band are sensed with a high sensitivity and pressure changes outside the band are not sensed with a high sensitivity (e.g., attenuated). In some embodiments, $f_L$=0.1 Hz and $f_H$=100 Hz. In further embodiments, the high frequency cutoff is further limited to $f_H$=10 Hz. In some embodiments, the low frequency cutoff is increased to $f_L$=0.5 Hz. In alternative embodiments, the bandpass could include any range within $f_L$=0 Hz to $f_H$=1000 Hz.

FIG. 3b illustrates a frequency response for a filter used in an embodiment dynamic pressure sensor. According to various embodiments, the usable bandwidth is not limited by the low frequency cutoff $f_L$, as post-processing of transduced signals may be performed. Specifically, plot 140 depicts a filter implementation of an integrator that extends the usable bandwidth of an embodiment dynamic pressure sensor below the low frequency cutoff $f_L$. Such a filter may be implemented as an analog filter circuit, a digital logic filter, or a software filter in any type of post-processing block. In some embodiments, such a filter allows the absolute pressure to be tracked. Further, in various embodiments, the high and low frequency cutoffs $f_H$ and $f_L$ may be implemented as mechanical filters, electrical filters, or a combination of mechanical and electrical filters.

Figure 4:
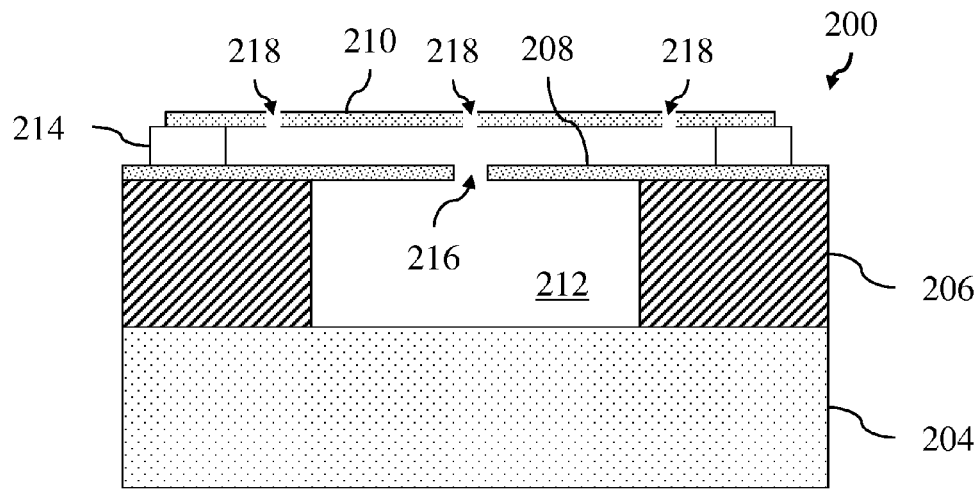
FIG. 4 illustrates a cross-sectional view of another embodiment dynamic pressure sensor.

FIG. 4 illustrates a cross-sectional view of another embodiment dynamic pressure sensor 200 that may be an implementation of dynamic pressure sensor 104. Dynamic pressure sensor 200 is fabricated in a manner similar to a MEMS microphone, as is described below in reference to FIGS. 11a-11r. According to various embodiments, dynamic pressure sensor 200 includes substrate 204, sidewalls 206, deflectable membrane 208, rigid backplate 210, and cavity 212. Backplate 210 is separated from membrane 208 by spacers 214. Membrane 208 includes ventilation hole 216 and backplate 210 includes perforations 218.

In some embodiments, a pressure change in the ambient environment produces a pressure difference between cavity 212 and the ambient environment that causes membrane 208 to deflect. The deflection of membrane 208 changes the distance between membrane 208 and backplate 210. The change in distance changes the effective capacitance between the two plates and produces a transduced electrical signal on a readout electrode (not shown). The transduced electrical signal corresponds to the change in pressure that occurred. As discussed briefly above, dynamic pressure sensor 200 includes a bandpass frequency response. Thus, only pressure changes occurring with frequencies within the bandpass range will be sensed. According to some embodiments, dynamic pressure sensor 200 may be implemented as a MEMS microphone and the bandpass frequency response may be implemented by digital or analog filters. In one such embodiment, the MEMS microphone may be covered or insulated with an acoustically muffling material, such as foam for example, in order to reduce acoustic noise for better dynamic pressure sensing.

In various embodiments, the size (planar area) of ventilation hole 216 affects the low frequency cutoff $f_L$ and the size and number of perforations 218 affects the high frequency cutoff $f_H$. In further embodiments, the mass of membrane 208 also affects the high frequency cutoff $f_H$. In still further embodiments, other factors may adjust the high and low frequency cutoffs $f_H$ and $f_L$. For example, the volume of the cavity, the size of the membrane (set by radius of cavity), the thickness of the membrane, and other features may affect the high and low frequency cutoffs $f_H$ and $f_L$. In a specific embodiment, the low frequency cutoff $f_L$ is proportionally given by the equation, $$f_L \propto \frac{N_{vent} D_{vent}^3}{V}$$

Where $N_{vent}$ is the number of ventilation holes, $D_{vent}$ is the diameter of the ventilation holes, and V is the volume of that cavity. In some embodiments, one ventilation hole 216 is set in membrane 208 and $N_{vent}=1$. Ventilation hole 216 may be set in the center as shown. In other embodiments, membrane 208 may include multiple ventilation holes and $N_{vent}>1$. In such embodiments, the ventilation holes may be distributed around the circumference of membrane 208 and the diameter $D_{vent}$ of each hole is smaller than in the $N_{vent}=1$ case. In a particular example, $N_{vent}$ is less than 30, $D_{vent}$ is less than 10 µm, and V is less than 15 mm³. In other examples, $D_{vent}$ is increased as $N_{vent}$ is decreased. In one specific embodiment, $D_{vent}$ is equal to about 5 µm.

According to various embodiments, backplate 210 has a thickness between 0.5 µm and 5 µm, perforations 218 have diameters between 0.5 µm and 10 µm, membrane 208 has a thickness between 0.1 µm and 1 µm, cavity 212 has a diameter between 0.2 mm and 2 mm and a thickness between 0.1 mm and 1 mm, and the separation distance between backplate 210 and membrane 208 as set by spacers 214 is between 0.5 µm and 5 µm.

Figure 5:
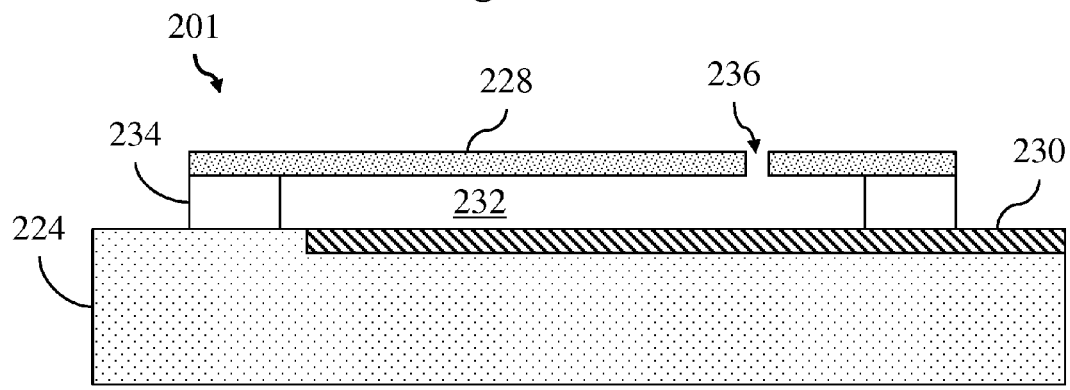
FIG. 5 illustrates a cross-sectional view of a further embodiment dynamic pressure sensor.

FIG. 5 illustrates a cross-sectional view of a further embodiment dynamic pressure sensor 201 that may be used to implement dynamic pressure sensor 104. Dynamic pressure sensor 201 is fabricated in a manner similar to conventional MEMS pressure sensors, as is described below in reference to FIGS. 12a-12h According to various embodiments, dynamic pressure sensor 201 includes substrate 224, electrode 230, membrane 228, and cavity 232. Membrane 228 include ventilation hole 236. In other embodiments, ventilation hole 236 include multiple ventilation holes that may be distributed anywhere on membrane 228, such as around the circumference of cavity 232, for example. Membrane 228 is separated from electrode 230 by insulators 234.

Similar to dynamic pressure sensor 200, a pressure change in the ambient environment causes membrane 228 of dynamic pressure sensor 201 to deflect and produces a transduced signal. Dynamic pressure sensor 201 also includes a bandpass frequency response. In some embodiments, the low frequency cutoff $f_L$ is given approximately by the equation, $$f_L = \frac{1}{2 \cdot \pi \cdot (R_{vent} + R_{squeeze}) \cdot C_{gap}}$$

where $R_{vent}$ is the ventilation resistance, $R_{squeeze}$ is the squeeze film resistance, and $C_{gap}$ is the capacitance between membrane 228 and electrode 230. In some embodiments, the mass of the membrane affects the high frequency cutoff $f_H$.

Figure 6:
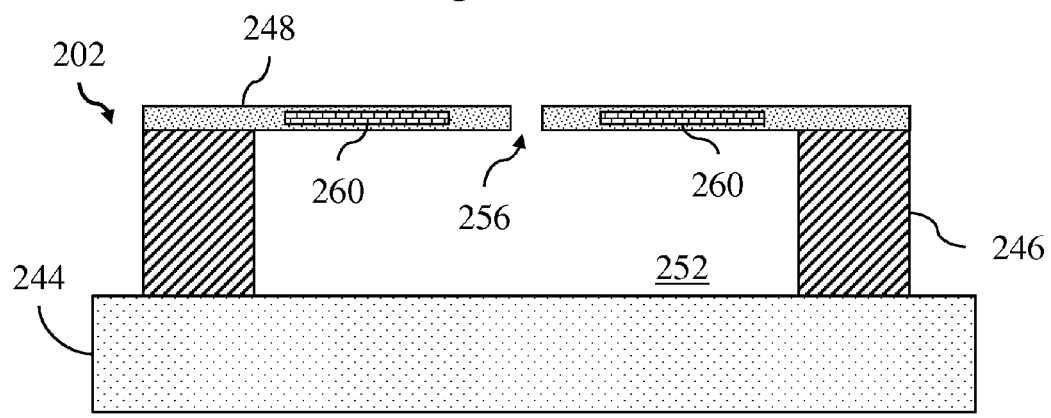
FIG. 6 illustrates a cross-sectional view of an additional embodiment dynamic pressure sensor.

FIG. 6 illustrates a cross-sectional view of an additional embodiment dynamic pressure sensor 202. According to various embodiments, dynamic pressure sensor 202 is a piezoresistive or piezoelectric pressure sensor that includes substrate 244, sidewalls 246, membrane 248, and cavity 252. Disposed on membrane 248 or included within it are piezosensors 260. Membrane 248 also includes ventilation hole 256. Piezo-sensor 260 may be implemented as a piezoelectric material or a piezoresistive material.

In various embodiments, pressure changes in the ambient environment cause deflections of membrane 248. For a piezoresistive material, the deflections change the resistance of piezo-sensor 260 and the resistance is measured by readout electrodes (not shown). For a piezoelectric material, the deflections cause piezo-sensor 260 to generate a voltage that is supplied to readout electronics (not shown). As discussed above in reference to the other figures, the mechanical properties of membrane 248 affect the bandpass response of dynamic pressure sensor 202 by adjusting the high and low cutoff frequencies $f_H$ and $f_L$.

Figure 7:
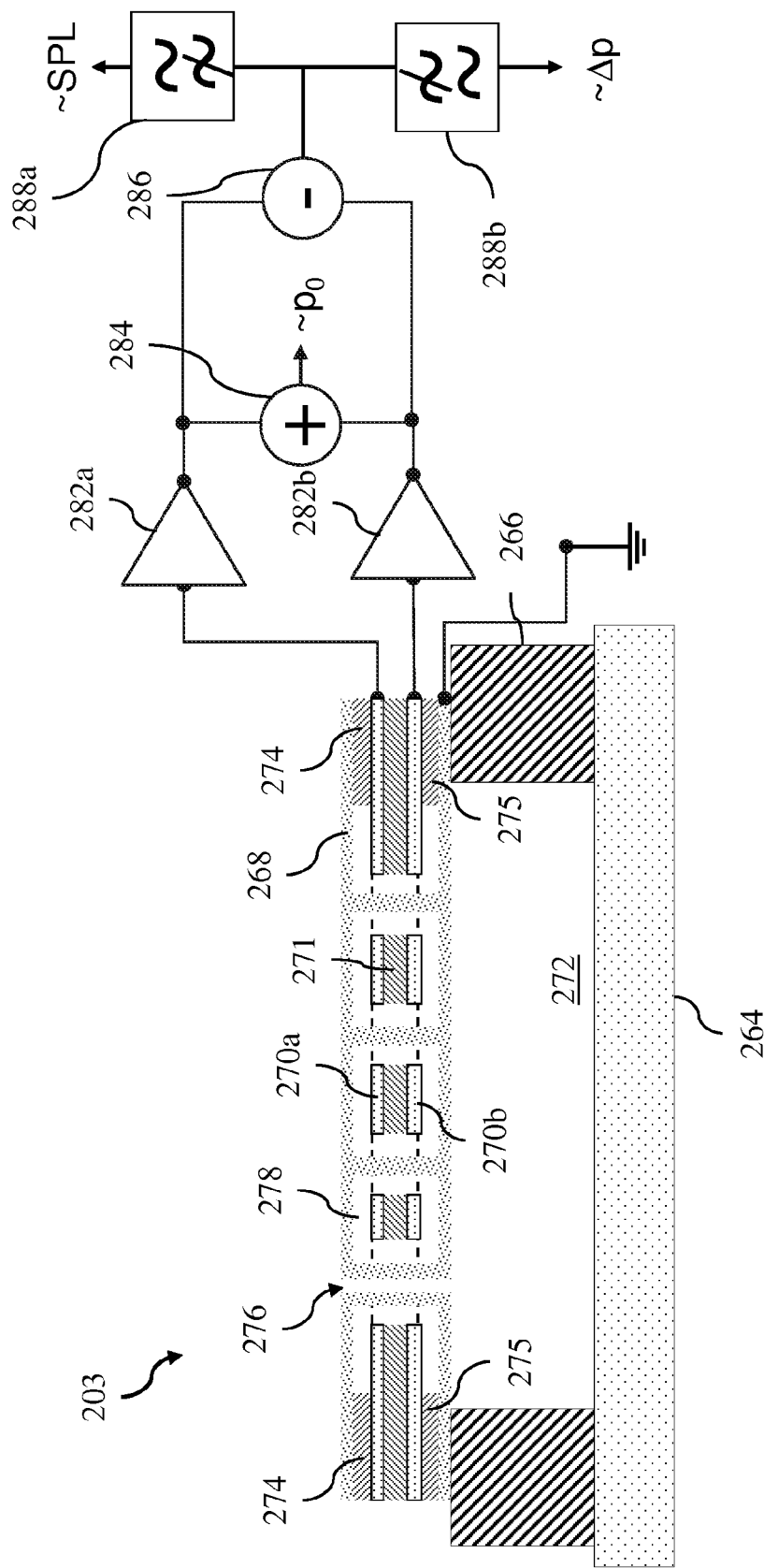
FIG. 7 illustrates a cross-sectional view of still another embodiment dynamic pressure sensor.

FIG. 7 illustrates a cross-sectional view of still another embodiment dynamic pressure sensor 203 including substrate 264, sidewalls 266, cavity 272, deflectable membrane 268, a rigid backplate with upper and lower electrodes 210a and 210b, amplifiers 282a and 282b, summation block 284, difference block 286, and filters 288a and 288b. A similar structure as dynamic pressure sensor 203, and the manufacture thereof, is described in the co-pending application with application Ser. No. 13/931,584 entitled "MEMS Microphone with Low Pressure Region between Diaphragm and Counter Electrode" filed Jun. 28, 2013, which is incorporated herein by reference in its entirety and also in the co-pending application with application Ser. No. 14/198,634 entitled "MEMS Sensor Structure for Sensing Pressure Waves and a Change in Ambient Pressure" filed Mar. 6, 2014, which is incorporated herein by reference in its entirety. The co-pending applications describe a MEMS microphone structure and a static MEMS pressure sensor.

For use as a dynamic pressure sensor according to embodiments described herein, dynamic pressure sensor 203 includes a bandpass frequency response with a high cutoff frequency $f_H<1000$ Hz and low frequency cutoffs $f_L>0.1$ Hz. In various embodiments, the mechanical structure including the size of ventilation hole, for example, are modified from the structures described in the co-pending applications in order to implement the bandpass frequency response described herein.

According to various embodiments, each amplifier 282a and 282b senses the backplate voltages on backplates 270a and 270b, respectively. When membrane 268 moves, the amplifier outputs from amplifiers 282a and 282b produce two signals, one signal proportional and one signal inversely proportional to the membrane movement. In such embodiments, the difference of the two signals, given at the output of difference block 286, is proportional to membrane movement and, thus, the applied acoustic pressure. Since the MEMS structure has a ventilation hole 276, the signal 286 exhibits a high pass characteristic as described above, which is a feature of a dynamic pressure sensor. If this high pass characteristic is set low enough, the output signal from difference block 286 may contain both voice signals (20 Hz to 20 kHz) and infrasonic pressures signals for gesture recognition and/or indoor navigation (1 Hz to 10 Hz). As shown, various embodiments select the signals with high-pass filter 288a and low-pass filter 288b. In such embodiments, a combined microphone and dynamic pressure sensor may be implemented.

In further embodiments, absolute pressure measurement signals may be generated by the same structure. According to various embodiments, cavity 278 is a sealed volume formed by membrane 268. Absolute pressure changes may affect the distance between the upper and lower part of membrane 268. In some embodiments, such an effect may change the sensitivity of the microphone system; however it may be beneficial in some embodiments. The amount the distance changes may be measured by evaluating the sum of the amplifier outputs from amplifiers 282a and 282b using adder 284. In such embodiments, the generated sum signal is proportional to absolute pressure and may be used for altimeter functions and also may be used to compensate for the sensitivity changes in the microphone system.

Figure 8:
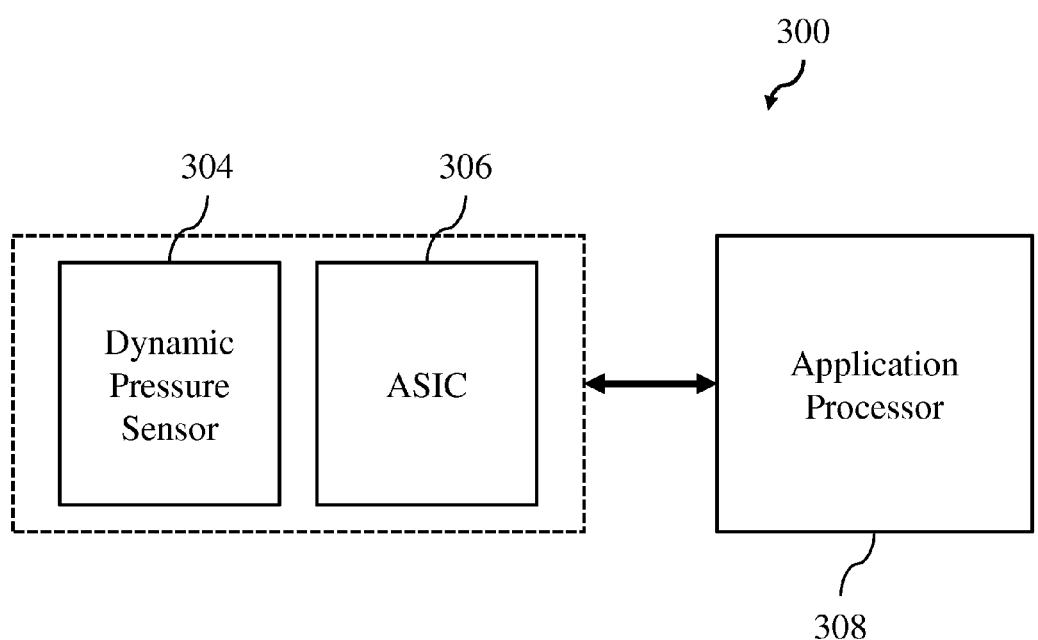
FIG. 8 illustrates a block diagram of an embodiment dynamic pressure sensor system.
Figure 10:
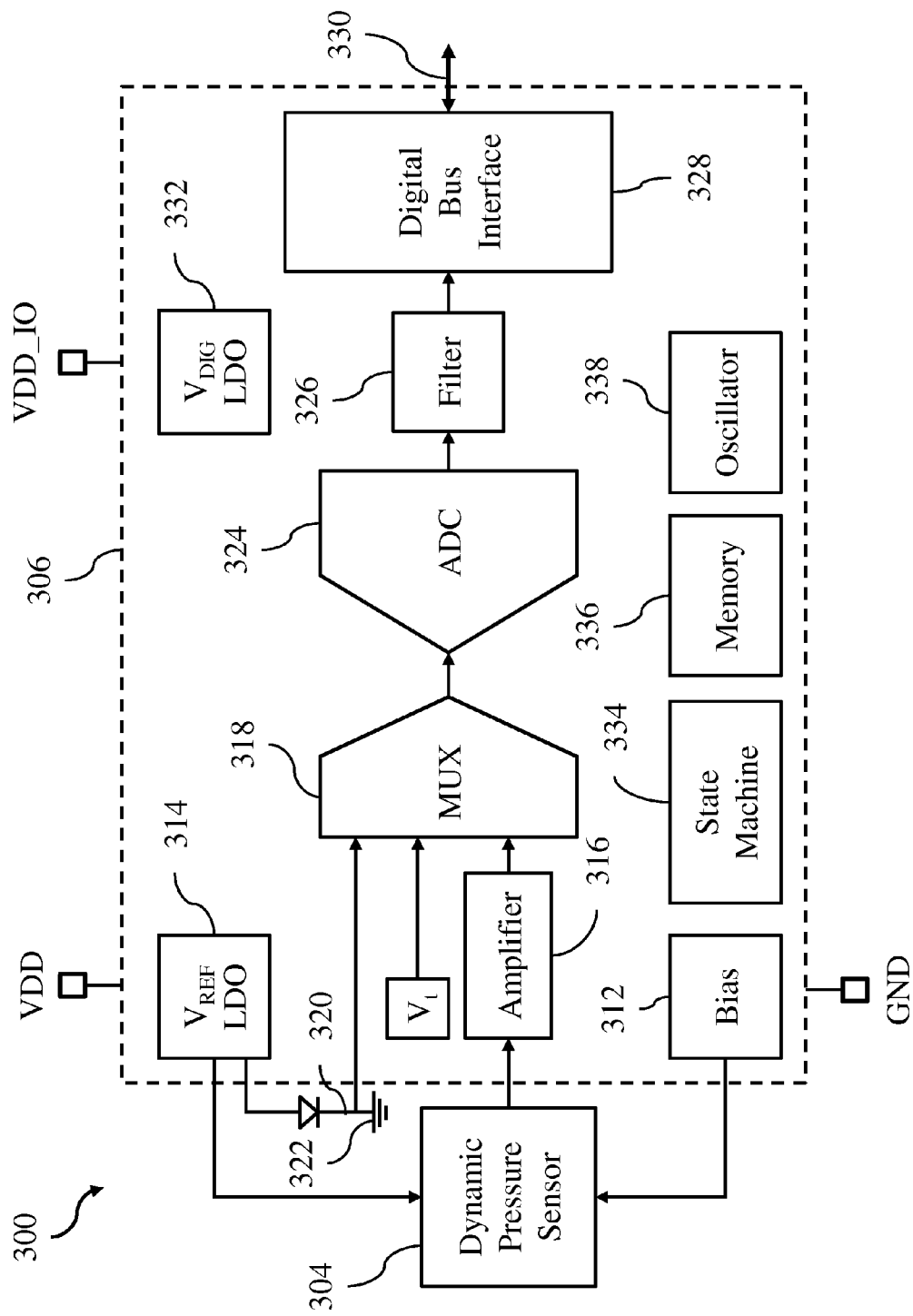
FIG. 10 illustrates a detailed block diagram of an embodiment dynamic pressure sensor system.

FIG. 8 illustrates a block diagram of an embodiment dynamic pressure sensor system 300 including a dynamic pressure sensor 304 with an integrated circuit (IC) 306 coupled to an application processor 308. Dynamic pressure sensor 304 may function according to any of the embodiments described herein or equivalents. IC 306 may be any type of integrated circuit, microprocessor, microcontroller, or other processing device suitable for an intended purpose. A specific example implementation of IC 306 is depicted in FIG. 10 below. According to various embodiments, IC 306 and application processor 308 convert and analyze pressure changes sensed by dynamic pressure sensor 304. Depending on the specific implementation, IC 306 and application processor 308 may perform different functions. In an example embodiment involving elevation tracking, IC 306 may convert and filter a sensed pressure signal before provided the converted and filtered signal to application processor 308. Application processor 308 may track the elevation changes in order to determine a current elevation. In one embodiment, application processor 308 performs an integration function of the sensed pressure changes and determines a current elevation. According to various embodiments, due to the increased sensitivity of dynamic pressure sensor 304 versus absolute pressure sensors, application processor 308 may determine elevation changes with sub centimeter precision. In other embodiments, IC 306 may implement the integration function or other pressure change tracking and application processor 308 may be used for other system functions or be omitted in some embodiments.

Figure 9A:
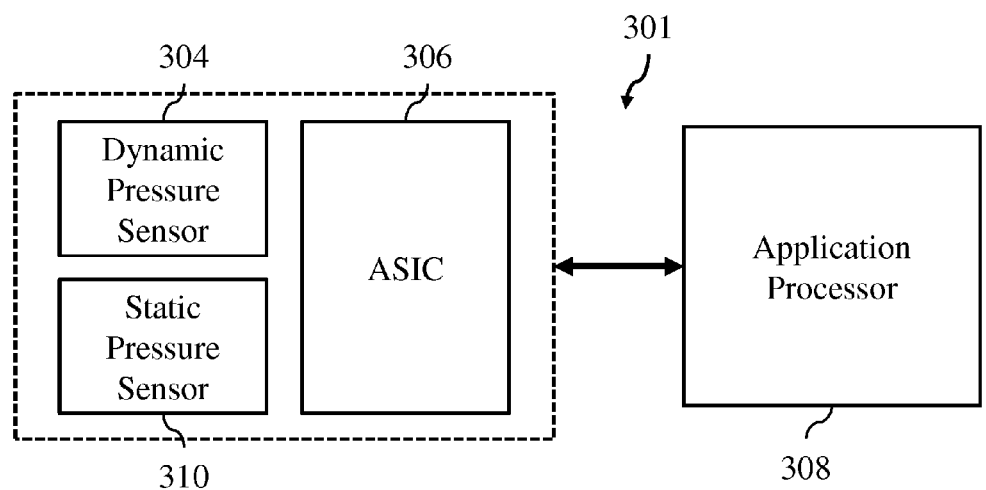
FIGS. 9a and 9b illustrate block diagrams of further embodiment dynamic pressure sensor systems.
Figure 9B:
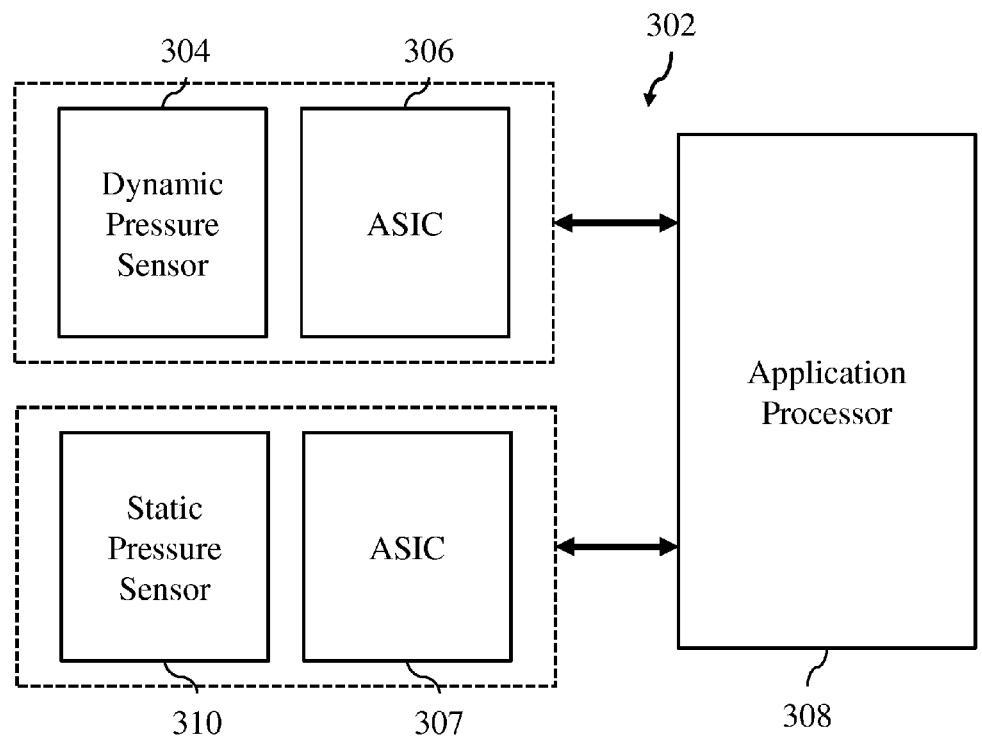

FIGS. 9a and 9b illustrate block diagrams of further embodiment dynamic pressure sensor systems 301 and 302, each including a static pressure sensor 310 in combination with dynamic pressure sensor 304 as previously described. According to various embodiments, FIG. 9a depicts dynamic pressure sensor systems 301, which includes dynamic pressure sensor 304, static pressure sensor 310, and IC 306 in a grouping that may be implemented on a single IC, as a system on a chip (SoC) or as multiple components on a package or printed circuit board (PCB). Dynamic pressure sensor 304, static pressure sensor 310, and IC 306 are coupled together through IC 306 to application processor 308. The functionality of each block is similar or identical to similar components in other embodiments described herein and will not be described again.

According to further embodiments, FIG. 9b depicts dynamic pressure sensor system 302, which includes dynamic pressure sensor 304 and IC 306 in a first grouping and static pressure sensor 310 and IC 307 in a second grouping. Each grouping may be implemented on a single IC, as a system on a chip (SoC) or as multiple components on a package or printed circuit board (PCB). In other embodiments, the two groupings with dynamic pressure sensor 304 and static pressure sensor 310 may be implemented as separate ICs in a SoC or on a PCB. Both dynamic pressure sensor 304 and static pressure sensor 310 are coupled together to application processor 308 through IC 306 and IC 307, respectively. The functionality of each block is similar or identical to similar components in other embodiments described herein and will not be described again.

FIG. 10 illustrates a detailed block diagram of an embodiment dynamic pressure sensor system including dynamic pressure sensor 304 and a more detailed embodiment of IC 306. According to various embodiments, dynamic pressure sensor 304 is biased with bias block 312 and reference voltage $V_{REF}$ from reference block 314, which may be a low-dropout regulator (LDO). Dynamic pressure sensor 304 supplies a sensed and transduced pressure change to amplifier 316, and multiplexer 318 selects the amplified pressure signal, a temperature (of the IC or sensor) proportional voltage $V_t$, or a reference voltage from node 320 that is coupled to reference terminal 322 and LDO 314. The output of multiplexer 318 is converted to a digital signal by analog to digital converter (ADC) 324, filtered by filter 326, and interfaced with digital bus 330 by digital bus interface 328. IC 306 may also include a digital voltage reference supplied by LDO 332, state machine 334 for digital logic operations, memory 336 for digital operations or filtering, and oscillator 338 to clock any digital blocks. IC 306 is supplied with reference terminals VDD and GND as well as input/output (I/O) voltage supply VDD_IO for coupling to digital bus 330.

In some embodiments, filter 326 may implement any of the processing or filtering steps as described in reference to processing circuit 106 above. For example, filter 326 may include an inverse high pass filter, low pass or high pass digital filters, or an integration function. In other embodiments, filter 326 is an analog filter and is rearranged to be coupled between MUX 318 and ADC 324.

Other embodiments may include different functional components and/or additional functional components in order to implement specific features of a sensor and/or interface IC. For example, in some embodiments, IC 306 may include digital correction algorithms used for linearizing sensed pressure signals. In some embodiments, temperature correction may be implemented using the temperature proportional voltage $V_t$. In various embodiments, IC 306 also provides temperature information and/or factory calibration data as a read out to digital bus 330.

Figure 11A:
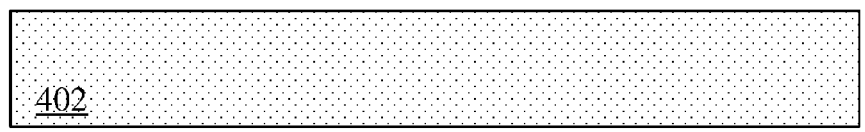
FIGS. 11a-11r illustrate a fabrication process flow for the embodiment dynamic pressure sensor of FIG. 4.
Figure 11B:
Figure 11C:
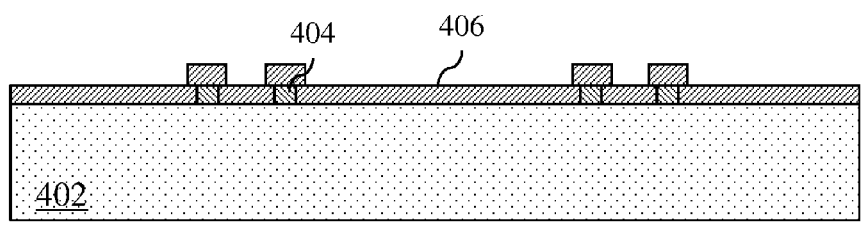
Figure 11D:
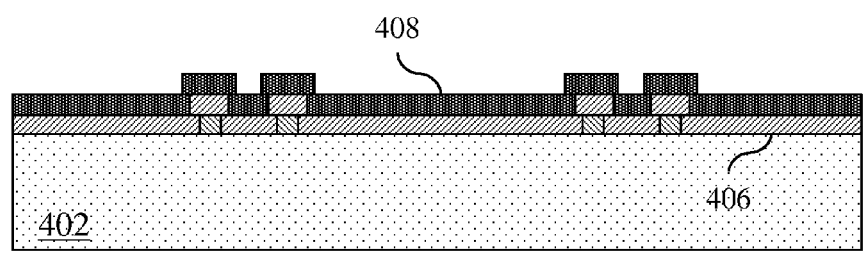
Figure 11E:
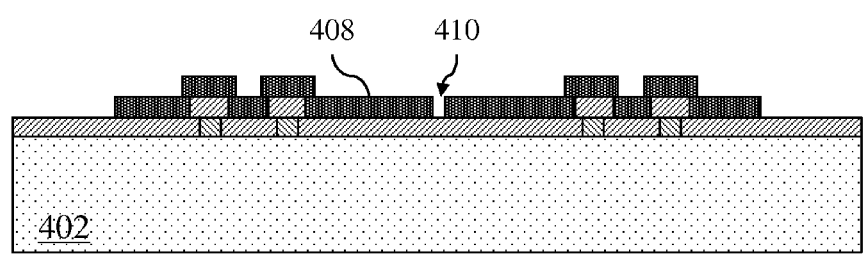
Figure 11F:
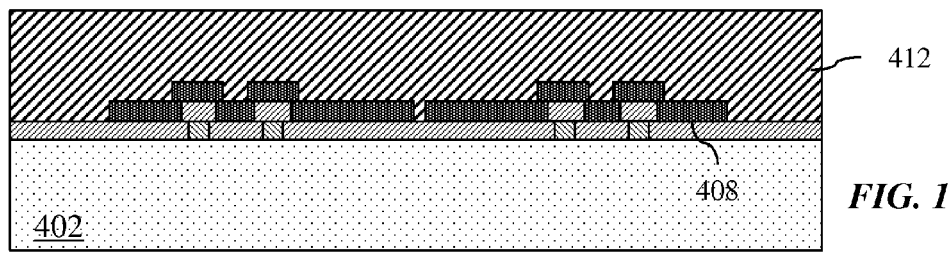
Figure 11G:
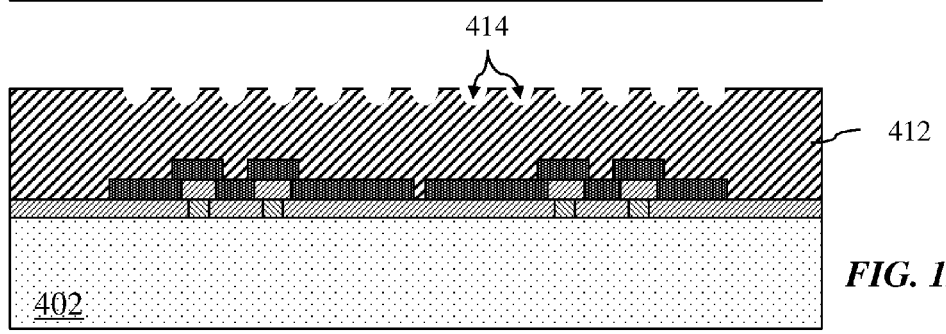
Figure 11H:
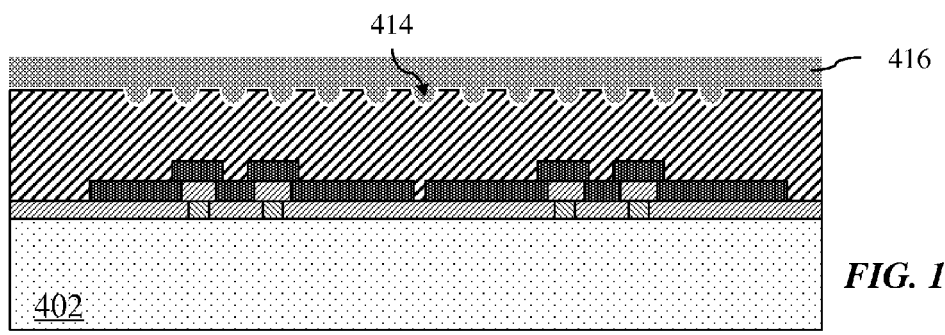
Figure 11I:
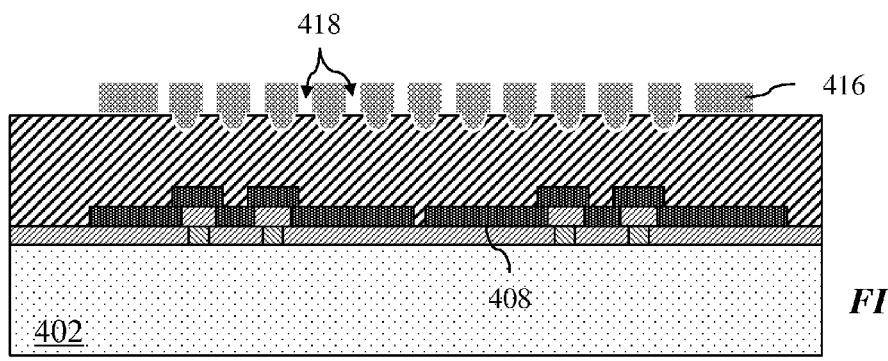
Figure 11J:
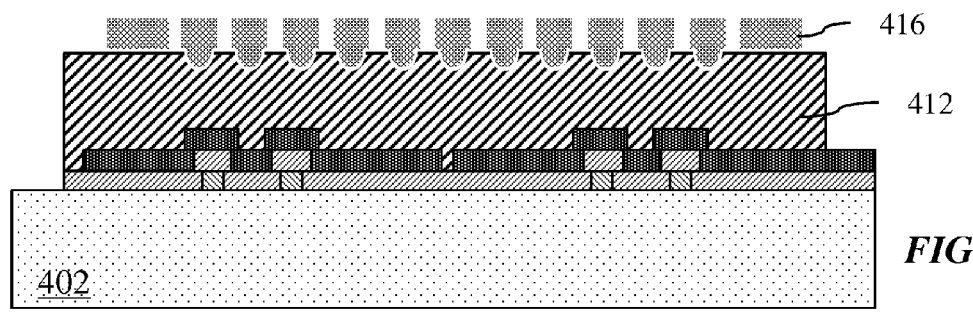
Figure 11K:
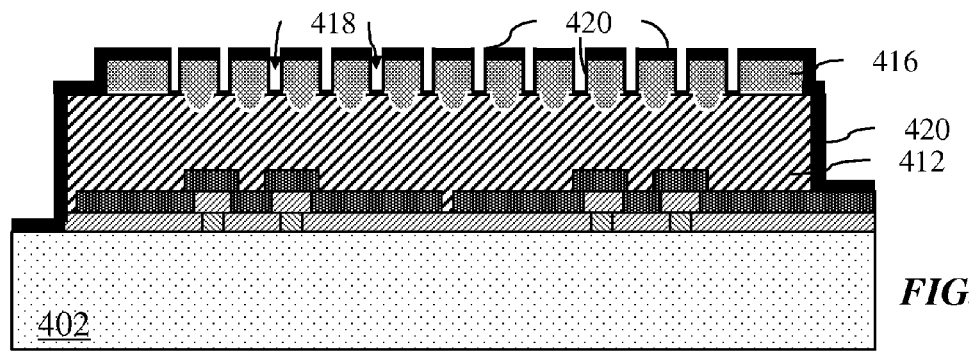
Figure 11L:
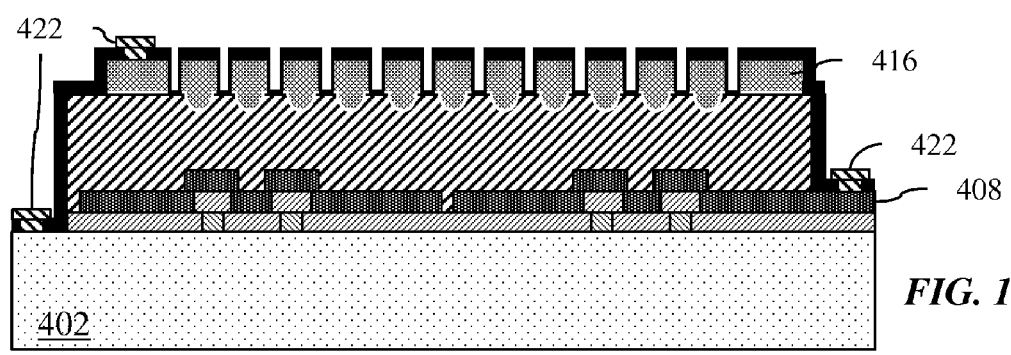
Figure 11M:
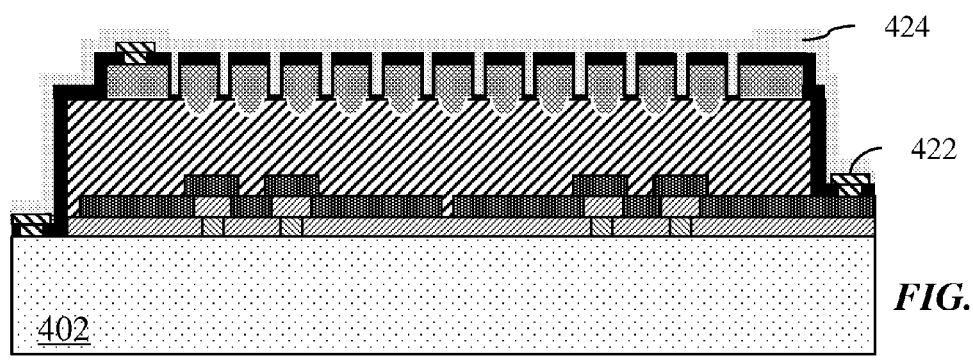
Figure 11N:
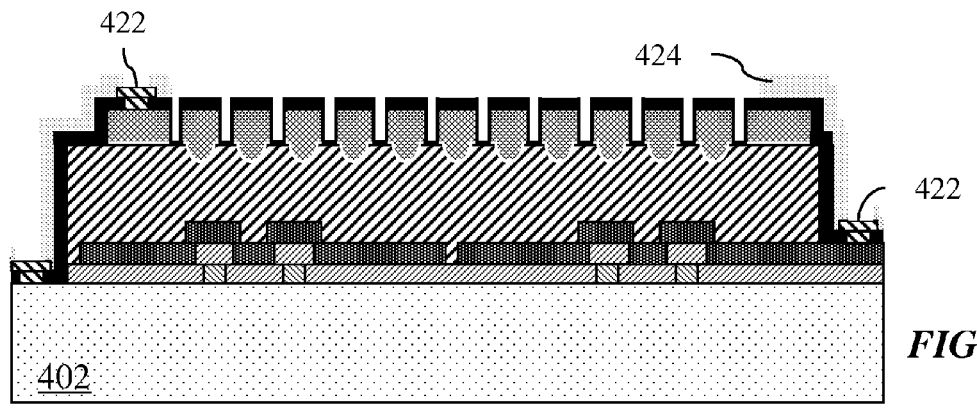
Figure 11O:
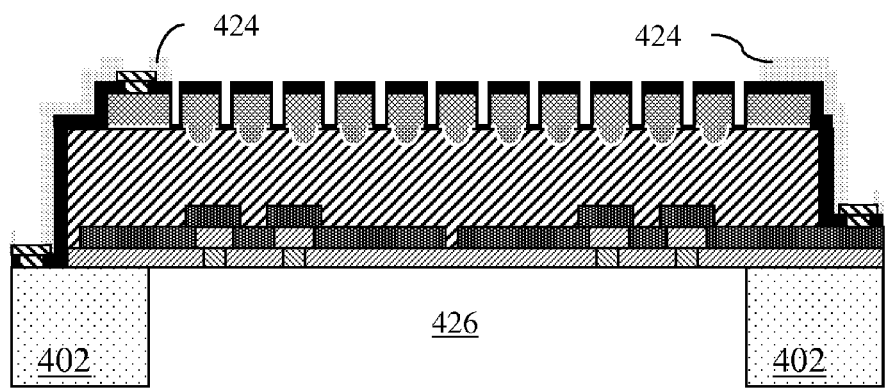
Figure 11P:
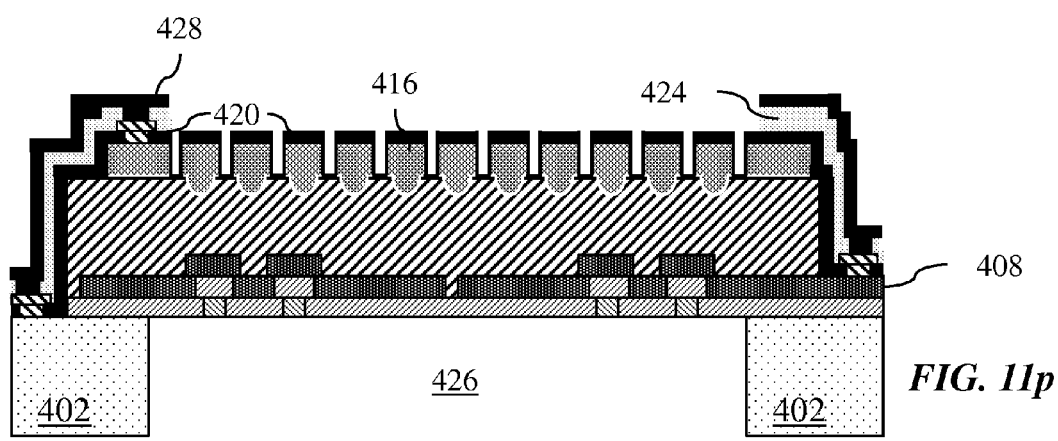
Figure 11Q:
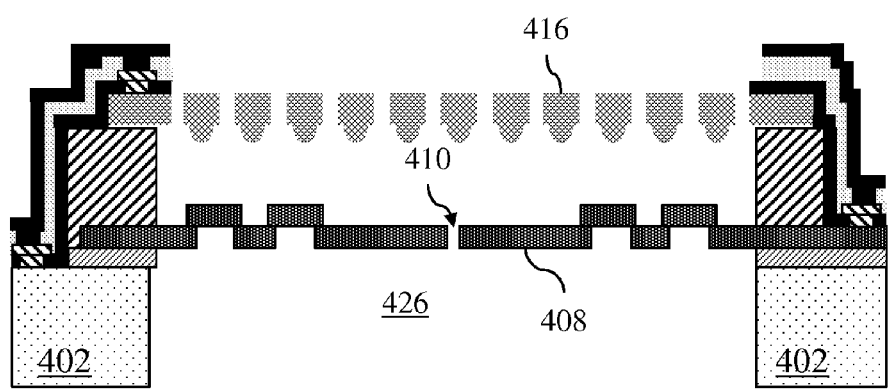
Figure 11R:
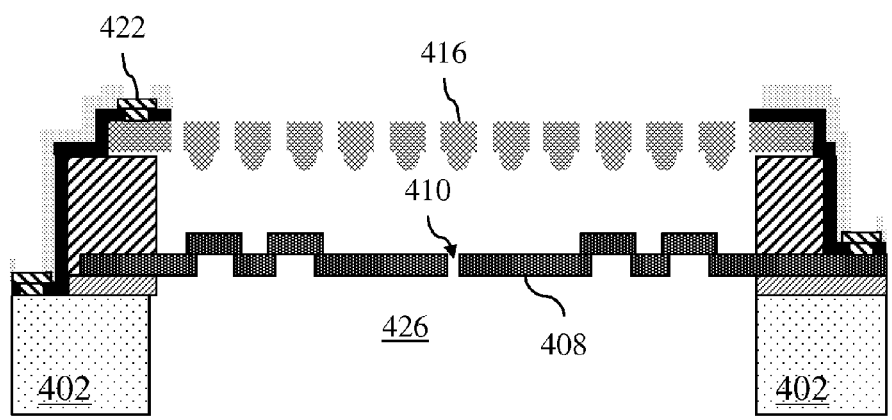

FIGS. 11a-11r illustrate an embodiment fabrication process flow for the embodiment dynamic pressure sensor of FIG. 4. According to various embodiments, FIG. 11a begins with silicon substrate 402. In alternative embodiments, substrate 402 may be a material other than silicon. FIG. 11b shows oxide bumps 404 that have been deposited or grown on substrate 402 and patterned. Oxides discussed in reference to FIGS. 11a-11r include semiconductor oxides, such as silicon dioxide, unless otherwise noted.

Another layer of oxide is deposited or grown forming membrane support 406 as shown in FIG. 11c. As shown, oxide bumps cause bumps or corrugation in membrane support 406. In FIG. 11d, a layer of polysilicon is deposited forming membrane 408. Membrane 408 includes corrugation due to oxide bumps 404. Membrane 408 may include doped or undoped polysilicon. For example, membrane 408 may be doped with phosphorous. In a next step, membrane 408 is patterned and ventilation hole 410 is formed as shown in FIG. 11e. As described previously, the planar area of ventilation hole 410, as set by the diameter of ventilation hole 410, affects the low frequency cutoff $f_L$ of the bandpass responses characteristic of various embodiments. Further, the thickness of membrane 408, affecting the mass and stiffness, also affects the bandpass response including the high frequency cutoff $f_H$ and the sensitivity of the final dynamic pressure sensor device.

After membrane 408 is patterned, a thick oxide is deposited to form backplate support 412 as shown in FIG. 11f. FIG. 11g depicts the next step, during which backplate support 412 is patterned to form holes 414. Then, as shown in FIG. 11h, backplate 416 is deposited. Backplate 416 may be formed of doped or undoped polysilicon, metal, or various other conductive materials. As shown in FIG. 11h, holes 414 cause dimples to form in backplate 416.

In FIG. 11i, backplate 416 is patterned with perforations 418. Perforations 418 are placed throughout the structure of backplate 416 in order to allow airflow through backplate 416 that may displace membrane 408 during operation of the completed device. Backplate support 412 is patterned as shown in FIG. 11j. The size (diameter) and number of perforations 418 in backplate 416 affect the high frequency cutoff $f_H$ in the characteristic bandpass response. After patterning backplate support 412, passivation layer 420 is deposited as shown in FIG. 11k. Passivation covers 420 the formed structures and also goes between perforations 418 in backplate 416. As shown in FIG. 11l, metallization contacts 422 are deposited and patterned making contact with substrate 402, backplate 416, and membrane 408.

Another passivation layer 424 is deposited as shown in FIG. 11m and patterned in order to expose contacts 422 as shown in FIG. 11n. A backside etch is performed in substrate 402 in order to form cavity 426 as shown in FIG. 11o. According to various embodiments, a BOSCH etch process is performed to implement the backside etch and form cavity 426. On top of passivation layers 420 and 424, temporary protection layer 428 is deposited as shown in FIG. 11p in order to protect backplate 416 and membrane 408 during the release step. The release step is performed releasing backplate 416 and membrane 408 as shown in FIG. 11q. Finally, temporary protection layer 428 is removed exposing contact 422 as shown in FIG. 11r.

Various modifications to the embodiment fabrication sequence described in FIGS. 11a-11r are envisioned. Further, the structure may be modified in numerous embodiments and modifications to the fabrication sequence will be expected. The various steps described herein and the accompanying figures are illustrative. According to various embodiments, structures may include sloped sidewalls, rough surfaces, and numerous dimensions. Fabrication methods may also be used as disclosed in U.S. Pat. No. 7,912,236 entitled "Sound Transducer Structure and Method for Manufacturing a Sound Transducer Structure" filed Dec. 6, 2006 and granted Mar. 22, 2011, which patent is incorporated herein by reference in its entirety.

Figure 12A:
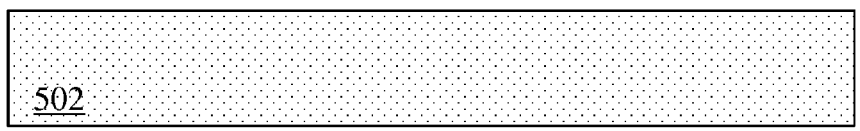
FIGS. 12a-12h illustrate a fabrication process flow for the embodiment dynamic pressure sensor of FIG. 5.
Figure 12B:
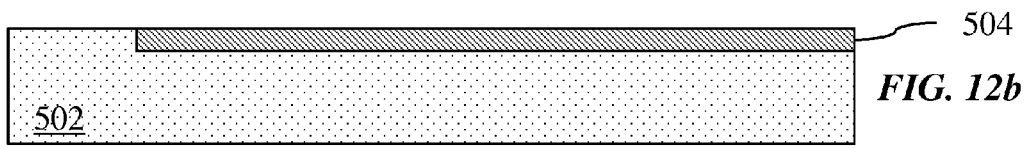

FIGS. 12a-12h illustrate an embodiment fabrication process flow for the embodiment dynamic pressure sensor of FIG. 5. The fabrication sequence begins with substrate 502 as shown in FIG. 12a. A sense electrode 504 is formed in substrate 502 as shown in FIG. 12b. According to various embodiments, substrate 502 may be doped or undoped silicon and sense electrode 504 may be formed by doping, such as through ion implantation, a region that becomes sense electrode 504. In one specific embodiment, substrate 502 is p-type doped silicon and sense electrode 504 is an n-type doped well in substrate 502. In an alternative embodiment, sense electrode 504 is a polysilicon layer separated from substrate 502 by a layer of oxide (not shown).

Figure 12C:
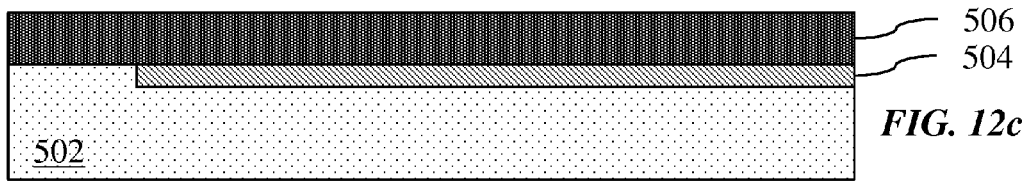
Figure 12D:
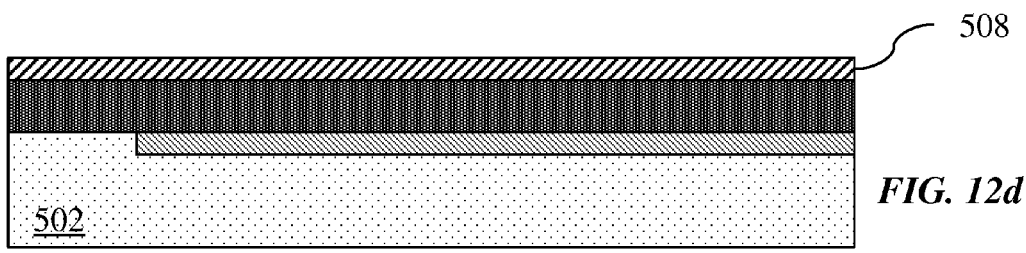
Figure 12E:
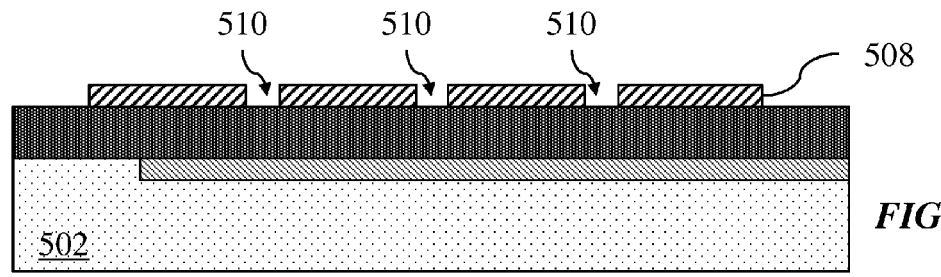

After sense electrode 504 is formed, oxide layer 506 is formed over substrate 502 and sense electrode 504 as shown in FIG. 12c. Then, in the proceeding step shown in FIG. 12d, membrane layer 508 is deposited. Membrane layer may be formed of doped or undoped polysilicon. In alternative embodiments, other conductive and deformable materials may be used. As shown in FIG. 12e, membrane layer 508 is then patterned and ventilation holes 510 are formed. In various embodiments, a single ventilation hole 510 or multiple ventilation holes may be formed of different sizes. The diameter of ventilation holes 510 affects the low frequency cutoff $f_L$ of the bandpass response. The thickness, which sets the mass, of membrane layer 508 affects the high frequency cutoff $f_H$ of the bandpass response.

Figure 12F:
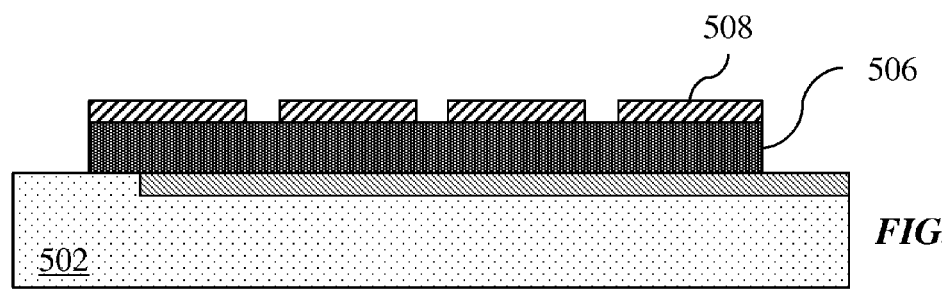
Figure 12G:
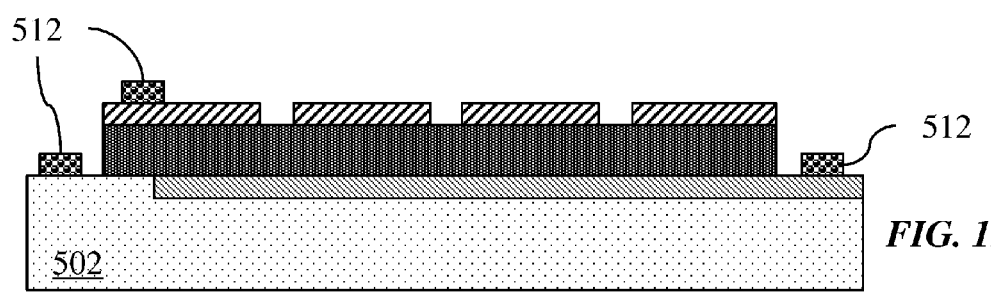
Figure 12H:
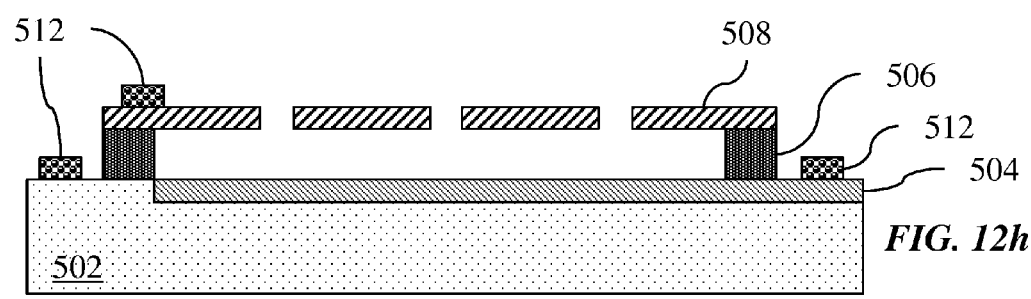

Oxide layer 506 is then patterned as shown in FIG. 12f. Metal contacts are deposited as shown in FIG. 12g. Finally, membrane layer 508 is released through a release etch removing part of oxide layer 506 as shown in FIG. 12h. The release etch produces the final dynamic pressure sensor according to this surface micromachining fabrication sequence. Various modifications to such a process will be readily apparent to one of ordinary skill in the art.

Figure 13:
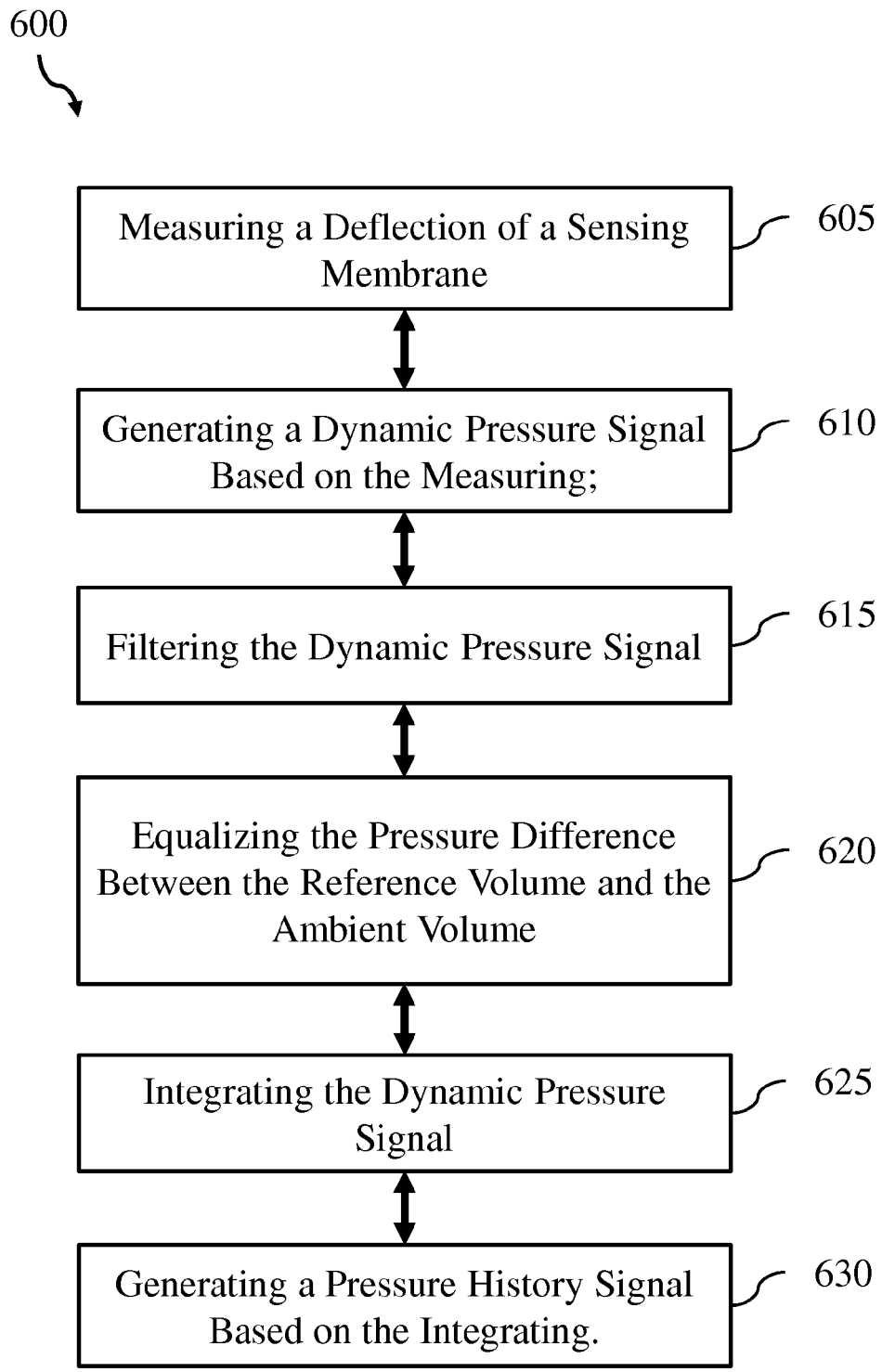
FIG. 13 illustrates a block diagram of an embodiment method of operation for a dynamic pressure sensor system.

FIG. 13 illustrates a block diagram of an embodiment method of operation 600 for a dynamic pressure sensor system including steps 605-630. According to various embodiments, step 605 includes measuring a deflection of a sensing membrane in response to a difference in pressure between a reference volume and an ambient volume. The sensing membrane separates the reference volume from the ambient volume and deflects when there is a pressure difference between the two volumes. Step 610 includes generating a dynamic pressure signal based on the measuring. In step 615, the dynamic pressure signal is filtered. Filtering the dynamic pressure signal includes removing frequency components of the dynamic pressure signal below 0.1 Hz and above 100 Hz. In another embodiment, filtering the dynamic pressure signal includes removing frequency components of the dynamic pressure signal below 10 Hz and above 1 kHz. In various embodiments, the low and high cutoff frequencies may be any frequencies depending on the applications. Step 620 includes equalizing the pressure difference between the reference volume and the ambient volume. Step 625 includes integrating the dynamic pressure signal. Finally, step 630 includes generating a pressure history signal based on the integrating. Steps 605-630 may be performed in numerous sequences in various embodiments and method 600 may also include other steps not listed.

According to various embodiments, a dynamic pressure sensor includes a substrate, a reference volume formed in the substrate, a deflectable membrane sealing the reference volume, a deflection sensing element coupled to the membrane and configured to measure a deflection of the membrane, and a ventilation hole configured to equalize an absolute pressure inside the reference volume with an absolute ambient pressure outside the reference volume. The dynamic pressure sensor includes a bandpass frequency response with an infrasonic low frequency cutoff and a high frequency cutoff of about 1 kHz.

In various embodiments, the dynamic pressure sensor also includes an absolute pressure sensor. In some embodiments, the low frequency cutoff is a function of a planar area of the ventilation hole. The ventilation hole may be a plurality of ventilation holes and the low frequency cutoff is a function of a sum of the planar areas of the plurality of ventilation holes. In some embodiments, the deflection sensing element includes a perforated backplate offset by a separation distance from the deflectable membrane and forming a capacitive sensor with the deflectable membrane. The perforated backplate includes a plurality of perforation holes.

In various embodiments, the high frequency cutoff is a function of a sum of the planar areas of the plurality of perforation holes. The dynamic pressure sensor may also include a readout integrated circuit (IC) coupled to the dynamic pressure sensor. In such embodiments, the IC records a history of pressure changes and outputs a signal related to the history of pressure changes. The signal related to the history of pressure changes may be produced by integrating the pressure changes. In some embodiments, the bandpass frequency response includes a low frequency cutoff of 0.1 Hz and a high frequency cutoff of 10 Hz.

According to various embodiments, a method of operating a dynamic pressure sensor includes measuring a deflection of a sensing membrane in response to a difference in pressure between a reference volume and an ambient volume, generating a dynamic pressure signal based on the measuring, filtering the dynamic pressure signal, equalizing the pressure difference between the reference volume and the ambient volume, processing the dynamic pressure signal, and generating a pressure history signal based on the processing. The sensing membrane separates the reference volume from the ambient volume. In such embodiments, filtering includes removing frequency components of the dynamic pressure signal below a first frequency and above a second frequency.

In various embodiments, the steps of measuring, generating, filtering, and equalizing are performed using a MEMS microphone. Further, removing frequency components of the dynamic pressure signal below the first frequency may be performed passively as a function of a mechanical structure of the sensing membrane. In some embodiments, measuring the deflection includes sensing the deflection of the sensing membrane using an electrode disposed on a substrate below the sensing membrane. In other embodiments, measuring the deflection includes sensing the deflection of the sensing membrane using a perforated capacitive backplate. Removing frequency components of the dynamic pressure signal above the second frequency may be performed passively as a function of a mechanical structure of the perforated capacitive backplate and the sensing membrane. In some embodiments, equalizing the pressure difference between the reference volume and the ambient volume includes passively equalizing the pressure difference through a ventilation hole connected between the reference volume and the ambient volume.

In various embodiments, the first frequency is 0.1 Hz and the second frequency is 10 Hz. The processing may include integrating the dynamic pressure signal. Alternatively, the processing may include applying an inverse high-pass filter function to the dynamic pressure signal. In some embodiments, the method also includes sensing an audio signal with the sensing membrane. The method may further include operating an audio processor to perform a first function and a second function. The first function includes the steps of processing the dynamic pressure signal and generating a pressure history signal based on the processing. The second function includes processing the sensed audio signal. In some embodiments, the audio processor switches between the first function and the second function based on a control signal.

According to various embodiments, a pressure sensing system includes a dynamic pressure sensor, an integrated circuit (IC) coupled to the dynamic pressure sensor, and an application processor coupled to the IC. The dynamic pressure sensor is configured to sense pressure changes including frequency components in a first frequency range. The IC is configured to generate a digital pressure signal based on the sensed pressure changes. The application processor is configured to determine a change in altitude based on the digital pressure signal.

In various embodiments, the dynamic pressure sensor includes a capacitive microelectromechanical system (MEMS) pressure sensor. The MEMS pressure sensor includes a deflectable membrane sealing a reference volume, a ventilation hole configured to equalize an absolute pressure inside the reference volume with an absolute ambient pressure outside the reference volume, and a perforated backplate capacitively coupled to the deflectable membrane and offset from the deflectable membrane outside the reference volume.

In various embodiments, the IC includes an amplifier, an analog to digital converter (ADC), and a filter. In some embodiments, the application processor determines the change in altitude by integrating the digital pressure signal. According to some embodiments, the deflectable membrane includes the ventilation hole. In some embodiments, the pressure sensing system may be incorporated into a mobile phone. The first frequency range may include frequencies between 0.1 and 20 kHz. In specific embodiments, the dynamic pressure sensor is a microphone.

According to various embodiments, a dynamic pressure sensor includes a microphone configured to dynamically sense pressure changes and an altitude measurement circuit coupled to the microphone. The altitude measurement circuit is configured to receive dynamic pressure signals from the microphone and determine a change in altitude based on the dynamic pressure signals.

In various embodiments, the altitude measurement circuit is configured to determine the change in altitude by applying a bandpass filter to the dynamic pressure signals and applying an inverse high-pass filter to the dynamic pressure signals in order to determine the change in altitude. The bandpass filter removes components from the dynamic pressure signals having frequency components below 0.1 Hz and above 10 Hz. In some embodiments, the dynamic pressure sensor also includes an audio processing circuit coupled to the microphone. The audio processing circuit is configured to receive audio signals from the microphone and generate an audio output signal.

Advantages of the various embodiments may include a dynamic pressure sensor with greatly increased sensitivity, reduced silicon area usage in some embodiments, and combined static and dynamic pressure sensing.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A dynamic pressure sensor comprising:
a substrate;
a reference volume formed in the substrate;
a deflectable membrane sealing the reference volume,
a ventilation hole formed in the deflectable membrane and configured to equalize an absolute pressure inside the reference volume with an absolute ambient pressure outside the reference volume; and a deflection sensing element coupled to the deflectable membrane and configured to measure a deflection of the deflectable membrane, wherein the dynamic pressure sensor comprises a bandpass frequency response comprising an infrasonic low frequency cutoff and a high frequency cutoff of about 1 kHz.

2. The dynamic pressure sensor of claim 1, further comprising an absolute pressure sensor.

3. The dynamic pressure sensor of claim 1, wherein the low frequency cutoff is a function of a planar area of the ventilation hole.

4. The dynamic pressure sensor of claim 3, wherein the ventilation hole comprises a plurality of ventilation holes, and wherein the low frequency cutoff is a function of a sum of the planar areas of the plurality of ventilation holes.

5. The dynamic pressure sensor of claim 3, wherein the deflection sensing element comprises a perforated backplate offset by a separation distance from the deflectable membrane and forming a capacitive sensor with the deflectable membrane, wherein the perforated backplate comprises a plurality of perforation holes.

6. The dynamic pressure sensor of claim 5, wherein the high frequency cutoff is a function of a sum of the planar areas of the plurality of perforation holes.

7. The dynamic pressure sensor of claim 1, further comprising a readout integrated circuit (IC) coupled to the dynamic pressure sensor.

8. The dynamic pressure sensor of claim 7, wherein the IC records a history of pressure changes and outputs a signal related to the history of pressure changes.

9. The dynamic pressure sensor of claim 8, wherein the signal related to the history of pressure changes is produced by integrating the pressure changes.

10. The dynamic pressure sensor of claim 1, wherein the bandpass frequency response comprises a low frequency cutoff of 0.1 Hz and a high frequency cutoff of 10 Hz.

11. A method of operating a dynamic pressure sensor, the method comprising:

measuring a deflection of a sensing membrane in response to a difference in pressure between a reference volume and an ambient volume, wherein the sensing membrane separates the reference volume from the ambient volume;

generating a dynamic pressure signal based on the measuring;

filtering the dynamic pressure signal, wherein filtering comprises removing frequency components of the dynamic pressure signal below a first frequency and above a second frequency;

equalizing the pressure difference between the reference volume and the ambient volume;

processing the dynamic pressure signal; and generating a pressure history signal based on the processing.

12. The method of claim 11, wherein the steps of measuring, generating, filtering, and equalizing are performed using a microelectromechanical system (MEMS) microphone.

13. The method of claim 11, wherein removing frequency components of the dynamic pressure signal below the first frequency is performed passively as a function of a mechanical structure of the sensing membrane.

14. The method of claim 11, wherein measuring the deflection comprises sensing the deflection of the sensing membrane using an electrode disposed on a substrate below the sensing membrane.

15. The method of claim 11, wherein measuring the deflection comprises sensing the deflection of the sensing membrane using a perforated capacitive backplate.

16. The method of claim 15, wherein removing frequency components of the dynamic pressure signal above the second frequency is performed passively as a function of a mechanical structure of the perforated capacitive backplate and the sensing membrane.

17. The method of claim 11, wherein equalizing the pressure difference between the reference volume and the ambient volume comprises passively equalizing the pressure difference through a ventilation hole connected between the reference volume and the ambient volume.

18. The method of claim 11, wherein the first frequency is 0.1 Hz and the second frequency is 10 Hz.

19. The method of claim 11, wherein processing comprises integrating the dynamic pressure signal.

20. The method of claim 11, wherein processing comprises applying an inverse high-pass filter function to the dynamic pressure signal.

21. The method of claim 11, further comprising sensing an audio signal with the sensing membrane.

22. The method of claim 21, further comprising operating an audio processor to perform a first function and a second function, wherein:

the first function comprises the steps of processing the dynamic pressure signal and generating a pressure history signal based on the processing; and the second function comprises processing the sensed audio signal.

23. The method of claim 22, wherein the audio processor switches between the first function and the second function based on a control signal.

24. A pressure sensing system comprising:

a dynamic pressure sensor, wherein the dynamic pressure sensor is configured to sense pressure changes including frequency components in a first frequency range, and wherein the dynamic pressure sensor comprises a capacitive microelectromechanical system (MEMS) pressure sensor, the MEMS pressure sensor comprising:

a deflectable membrane sealing a reference volume;

a ventilation hole formed in the deflectable membrane and configured to equalize an absolute pressure inside the reference volume with an absolute ambient pressure outside the reference volume;

a perforated backplate capacitively coupled to the deflectable membrane and offset from the deflectable membrane outside the reference volume;

an integrated circuit (IC) coupled to the dynamic pressure sensor, wherein the IC is configured to generate a digital pressure signal based on the sensed pressure changes; and an application processor coupled to the IC, wherein the application processor is configured to determine a change in altitude based on the digital pressure signal.

25. The pressure sensing system of claim 24, wherein the IC comprises an amplifier, an analog to digital converter (ADC), and a filter.

26. The pressure sensing system of claim 25, wherein the application processor determines the change in altitude by integrating the digital pressure signal.

27. The pressure sensing system of claim 24, wherein the deflectable membrane comprises the ventilation hole.

28. The pressure sensing system of claim 24, further comprising a mobile phone, wherein the pressure sensing system is incorporated into the mobile phone.

29. The pressure sensing system of claim 24, wherein the first frequency range includes frequencies between 0.1 Hz and 20 kHz.

30. The pressure sensing system of claim 24, wherein the dynamic pressure sensor is a microphone.

31. A dynamic pressure sensor comprising:
a microphone configured to dynamically sense pressure changes; and
an altitude measurement circuit coupled to the microphone, the altitude measurement circuit configured to receive dynamic pressure signals from the microphone and determine a change in altitude based on the dynamic pressure signals, wherein the altitude measurement circuit is configured to determine the change in altitude by:
applying a bandpass filter to the dynamic pressure signals, wherein the bandpass filter removes components from the dynamic pressure signals having frequency components below 0.1 Hz and above 10 Hz; and
applying an inverse high-pass filter to the dynamic pressure signals in order to determine the change in altitude.

32. A dynamic pressure sensor comprising:
a microphone configured to dynamically sense pressure changes;
an altitude measurement circuit coupled to the microphone, the altitude measurement circuit configured to receive dynamic pressure signals from the microphone and determine a change in altitude based on the dynamic pressure signals; and
an audio processing circuit coupled to the microphone, wherein the audio processing circuit is configured to receive audio signals from the microphone and generate an audio output signal.

* * * * *